(12) United States Patent
Suzuki

(10) Patent No.: US 11,769,446 B2
(45) Date of Patent: *Sep. 26, 2023

(54) DISPLAY DEVICE

(71) Applicant: KYOCERA Corporation, Kyoto (JP)

(72) Inventor: Takanobu Suzuki, Itami (JP)

(73) Assignee: KYOCERA Corporation, Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/881,102

(22) Filed: Aug. 4, 2022

(65) Prior Publication Data

US 2022/0375402 A1 Nov. 24, 2022

Related U.S. Application Data

(63) Continuation of application No. 17/254,911, filed as application No. PCT/JP2019/025990 on Jun. 28, 2019, now Pat. No. 11,430,377.

(30) Foreign Application Priority Data

Jun. 29, 2018 (JP) .................................. 2018-124151
Jun. 29, 2018 (JP) .................................. 2018-124152

(51) Int. Cl.
*G09G 3/32* (2016.01)

(52) U.S. Cl.
CPC ....... *G09G 3/32* (2013.01); *G09G 2300/0408* (2013.01); *G09G 2310/0202* (2013.01); *G09G 2310/0254* (2013.01); *G09G 2310/0267* (2013.01); *G09G 2320/0242* (2013.01)

(58) Field of Classification Search
CPC ............. G09G 3/32; G09G 2300/0408; G09G 2310/0202; G09G 2310/0254; G09G 2310/0267; G09G 2320/0242; G09G 3/3266; G09G 2300/0426; G09G 2310/0221; H10K 59/131; H01L 25/167; H01L 27/156; H01L 25/0753; G09F 9/33
See application file for complete search history.

(56) References Cited

U.S. PATENT DOCUMENTS

| 9,798,339 | B2 | 10/2017 | Tanaka et al. |
| 10,032,839 | B2 | 7/2018 | Kang et al. |
| 11,430,377 | B2* | 8/2022 | Suzuki ............... H01L 27/3276 |
| 2014/0049453 | A1 | 2/2014 | Lee et al. |

(Continued)

FOREIGN PATENT DOCUMENTS

| EP | 2399254 B1 | 8/2016 |
| JP | 2012-518208 A | 8/2012 |

(Continued)

*Primary Examiner* — Vijay Shankar
(74) *Attorney, Agent, or Firm* — Volpe Koenig

(57) ABSTRACT

A display device includes a substrate, a pixel array placed on a first surface side of the substrate, light emission control signal lines, scanning signal lines, a scanning signal line driving circuit, and a driving control signal line. The driving control signal line includes a first portion, a second portion, and third portions. The light emission control signal lines include a first light emission control signal line and a second light emission control signal line, and a number of intersecting portions of the first light emission control signal line and the first portion is smaller than a number of intersecting portions of the second light emission control signal line and the third portions.

5 Claims, 22 Drawing Sheets

(56) References Cited

U.S. PATENT DOCUMENTS

| | | |
|---|---|---|
| 2016/0019856 A1 | 1/2016 | Tanaka et al. |
| 2017/0025070 A1 | 1/2017 | Kang et al. |
| 2018/0218668 A1 | 8/2018 | Aoyagi et al. |

FOREIGN PATENT DOCUMENTS

| | | |
|---|---|---|
| JP | 2015-197543 A | 11/2015 |
| WO | 2010/096341 A1 | 8/2010 |
| WO | 2013/105347 A1 | 7/2013 |

* cited by examiner

| A7 | A6 | A5 | A4 | A3 | A2 | A1 | A0 | XA7 | XA6 | XA5 | XA4 | XA3 | XA2 | XA1 | XA0 | SELECTION GL |
|----|----|----|----|----|----|----|----|-----|-----|-----|-----|-----|-----|-----|-----|--------------|
| 0  | 0  | 0  | 0  | 0  | 0  | 0  | 0  | 1   | 1   | 1   | 1   | 1   | 1   | 1   | 1   | GL1          |
| 0  | 0  | 0  | 0  | 0  | 0  | 0  | 1  | 1   | 1   | 1   | 1   | 1   | 1   | 1   | 0   | GL2          |
| 0  | 0  | 0  | 0  | 0  | 0  | 1  | 0  | 1   | 1   | 1   | 1   | 1   | 1   | 0   | 1   | GL3          |
| .  | .  | .  | .  | .  | .  | .  | .  | .   | .   | .   | .   | .   | .   | .   | .   | .            |
| .  | .  | .  | .  | .  | .  | .  | .  | .   | .   | .   | .   | .   | .   | .   | .   | .            |
| 1  | 1  | 1  | 1  | 1  | 1  | 1  | 0  | 0   | 0   | 0   | 0   | 0   | 0   | 0   | 1   | GL255        |
| 1  | 1  | 1  | 1  | 1  | 1  | 1  | 1  | 0   | 0   | 0   | 0   | 0   | 0   | 0   | 0   | GL256        |

DISPLAY DEVICE

CROSS-REFERENCE TO RELATED APPLICATION

This application is a continuation application of U.S. patent application Ser. No. 17/254,911 filed on Feb. 8, 2021, which is a National Phase entry according to 35 U.S.C. 371 of International Application No. PCT/JP2019/025990 filed on Jun. 28, 2019, which claims priority to Japanese Patent Application Nos. 2018-124151 filed on Jun. 29, 2018, and 2018-124152 filed on Jun. 29, 2018, the contents of which are entirely incorporated herein by reference.

TECHNICAL FIELD

The present disclosure relates to a display device including a light emitting element such as a light emitting diode in a light emitting unit.

BACKGROUND ART

In the related art, there is known a self-luminous display device that includes a plurality of light emitting units including a light emitting element such as a light emitting diode and does not require a backlight device. For example, JP-A 2015-197543 (Patent Literature 1) discloses a display device including a display panel in which a plurality of light emitting diodes are arranged in a matrix form, and a gate driver and a source driver provided on the periphery of the display panel.

SUMMARY

In recent years, it is required to expand an image display section in a display device, and thus it is required to narrow the width of a frame portion on the periphery of the image display section or substantially eliminate the frame portion (hereinafter, collectively referred to as "making it frameless"). In the conventional display device as described in Patent Literature 1, the gate driver and the source driver are provided on the periphery of the image display section, and thus it is difficult to make it frameless.

Further, in recent years, it is required to expand the image display section in the display device, and accordingly, it is required to provide a display device in which the width of the frame portion on the periphery of the image display section is extremely narrowed or a display device in which the frame portion is substantially eliminated (hereinafter, collectively referred to as a "frameless display device"). In the display device in the related art disclosed in Patent Literature 1, driver circuits such as a gate driver and a source driver are provided on the periphery of an image display section, and thus it is difficult to make a frameless display device. Also, in order to provide a frameless display device, if the driver circuit and control signal lines for supplying a control signal to the driver circuit are simply placed in the image display section, there is a concern that a control signal transmitting through the control signal line affects a driving electric current of a light emitting element to generate the color unevenness on the displayed image.

The display device of the disclosure includes:

a substrate;

a pixel array which is placed on a first surface side of the substrate, and in which a plurality of light emitting units are arranged in a matrix form;

a plurality of light emission control signal lines which are arranged in each column of the pixel array on the first surface side;

a plurality of scanning signal lines which are arranged in each row of the pixel array on the first surface side;

a scanning signal line driving circuit which is placed on the first surface side and drives the plurality of scanning signal lines; and a driving control signal line which is placed on the first surface side and supplies a scanning line driving control signal to the scanning signal line driving circuit; wherein the driving control signal line includes at least one first portion which extends in a row direction of the pixel array, a second portion which is connected to the at least one first portion and extends in a column direction of the pixel array, and a plurality of third portions which are connected to the second portion and extend in an opposite direction to the at least one first portion in the row direction of the pixel array, and the plurality of light emission control signal lines includes at least one first light emission control signal line and at least one second light emission control signal line, and in a plan view of the display device, a number of intersecting portions of the at least one first light emission control signal line and the at least one first portion is smaller than a number of intersecting portions of the at least one second light emission control signal line and the plurality of third portions.

The display device of the disclosure includes:

a substrate;

a pixel array which is placed on a first surface side of the substrate, and in which a plurality of light emitting units are arranged in a matrix form;

a plurality of light emission control signal lines which are arranged in each column of the pixel array on the first surface side;

a plurality of scanning signal lines which are arranged in each row of the pixel array on the first surface side;

a scanning signal line driving circuit which is placed on the first surface side and drives the plurality of scanning signal lines;

a driving control signal line which is placed on the first surface side and supplies a scanning line driving control signal to the scanning signal line driving circuit, the driving control signal line including at least one first portion which extends in a row direction of the pixel array, a second portion which is connected to the at least one first portion and extends in a column direction of the pixel array, and a plurality of third portions which are connected to the second portion and extend in an opposite direction to the at least one first portion in the row direction of the pixel array; and a compensation signal line which is placed on the first surface side and to which an inversion signal of the scanning line driving control signal, or a signal with the opposite polarity to the scanning line driving control signal is supplied. The plurality of light emission control signal lines includes at least one first light emission control signal line and at least one second light emission control signal line, and in a plan view of the display device, a number of intersecting portions of the at least one first light emission control signal line and the at least one first portion is smaller than a number of intersecting portions of the at least one second light emission control signal line and the plurality of third portions. The compensation signal line includes a fourth portion which extends in the column direction of the pixel array and a plurality of fifth portions that are connected to the fourth portion and extend in the row direction of the pixel array, and in the plan view of the display device, a number of intersecting portions of the at least one first light emission control signal line and the plurality of fifth portions is smaller than a number of intersecting portions of the at least one second light emission control signal line and the plurality of fifth portions.

The display device of the disclosure includes:

a substrate;

a pixel array which is placed on a first surface side of the substrate, and in which a plurality of light emitting units are arranged in a matrix form;

a plurality of light emission control signal lines which are arranged in each column of the pixel array on the first surface side;

a plurality of scanning signal lines which are arranged in each row of the pixel array on the first surface side;

a scanning signal line driving circuit which is placed on the first surface side and drives the plurality of scanning signal lines;

a driving control signal line which is placed on the first surface side and supplies a scanning line drive control signal to the scanning signal line driving circuit, the driving control signal line including at least one first portion which extends in a row direction of the pixel array, a second portion which is connected to the at least one first portion and extends in a column direction of the pixel array, and a plurality of third portions which are connected to the second portion and extend in an opposite direction to the at least one first portion in the row direction of the pixel array; and a compensation signal line which is placed on the first surface side. The plurality of light emission control signal lines includes at least one first light emission control signal line and at least one second light emission control signal line, and in a plan view of the display device, a number of intersecting portions of at least one first light emission control signal line and the at least one first portion is smaller than a number of intersecting portions of the at least one second light emission control signal line and the plurality of third portions. The compensation signal line includes a fourth portion which extends in a column direction of the pixel array, a plurality of fifth portions which are connected to the fourth portion and extend in the row direction of the pixel array, and a sixth portion which is connected to the fourth portion and extends on a same side as extension of the plurality of fifth portions from the fourth portion, in the plan view of the display device, a number of intersecting portions of the at least one first light emission control signal line and the plurality of fifth portions is larger than a number of intersecting portions of the at least one second light emission control signal line and the plurality of fifth portions, and a signal with a same polarity as that of the scanning line driving control signal is supplied from an outside to the sixth portion.

According to the display device of the disclosure, a scanning signal line driving circuit can be arranged in the image display section, and it is possible to make the display device frameless.

According to the display device of the disclosure, it is possible to provide a frameless display device in which the color unevenness of the displayed image can be suppressed.

BRIEF DESCRIPTION OF DRAWINGS

Other and further objects, features, and advantages of the disclosure will be more explicit from the following detailed description taken with reference to the drawings wherein.

DETAILED DESCRIPTION

Figure 1:
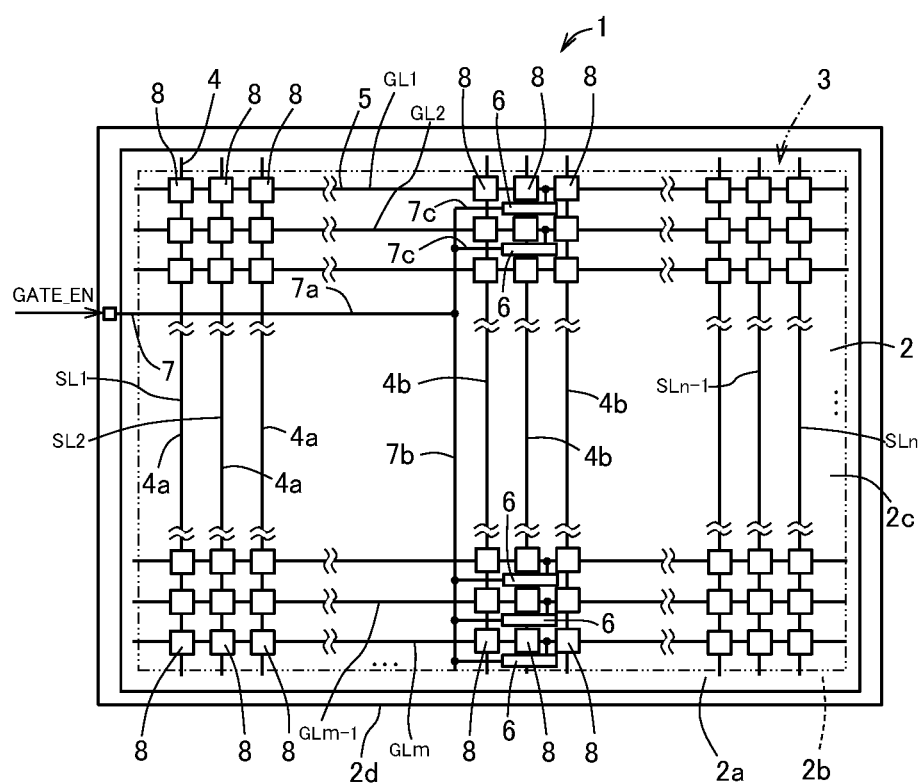
FIG. 1 is a diagram illustrating a schematic configuration of a display device of a first embodiment.

Hereinafter, embodiments of a display device of the disclosure are described with reference to the drawings. Each of the drawings referred to below illustrates the main parts for describing the display device of the disclosure among components in the embodiments of the display device of the disclosure. Therefore, the display device of the disclosure may include well-known components such as a circuit board, a wiring conductor, a control IC, and an LSI (not illustrated in the drawings).

Figure 2:
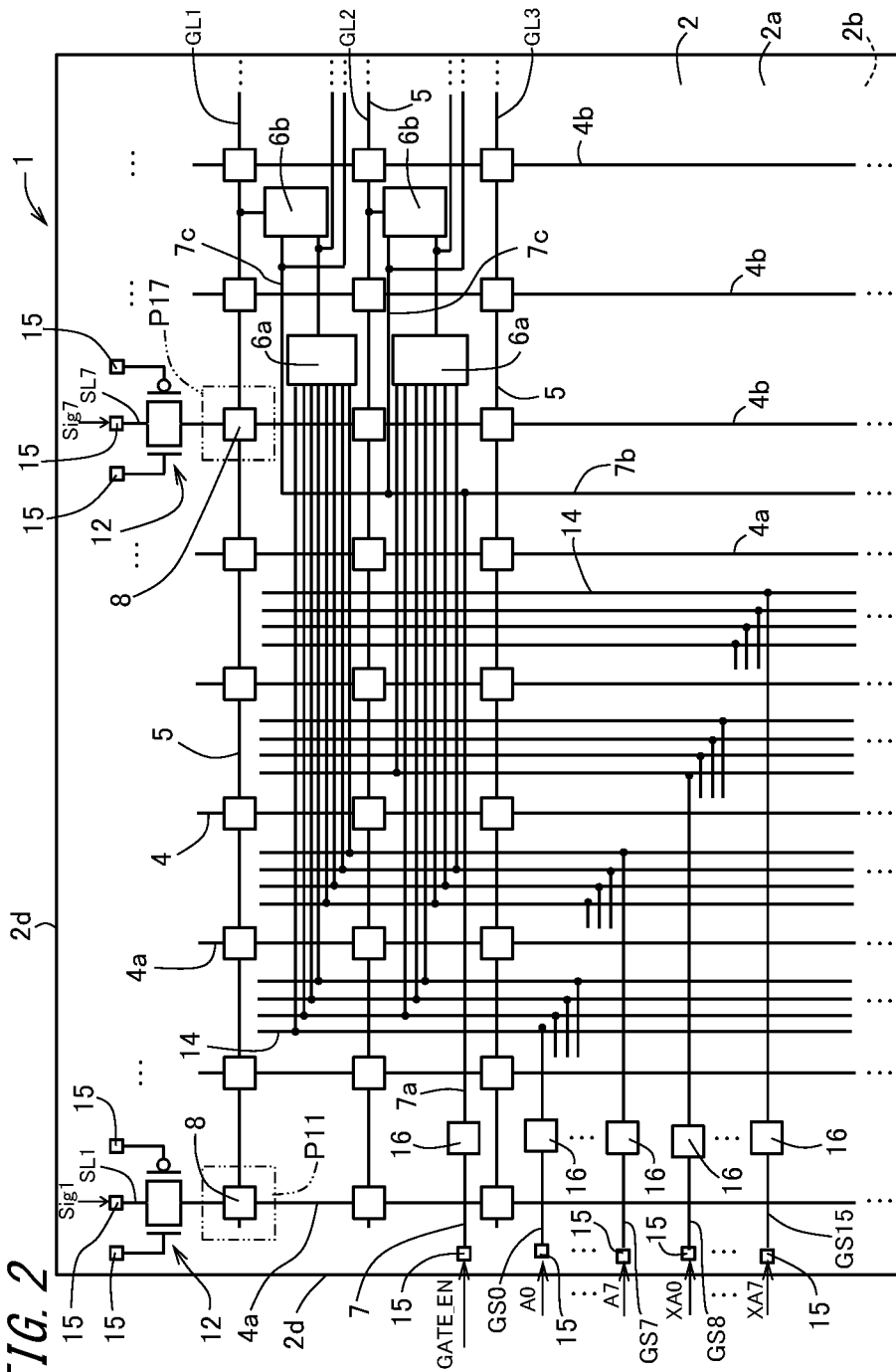
FIG. 2 is a block circuit diagram illustrating a basic configuration of the display device of the first embodiment.
Figure 3:
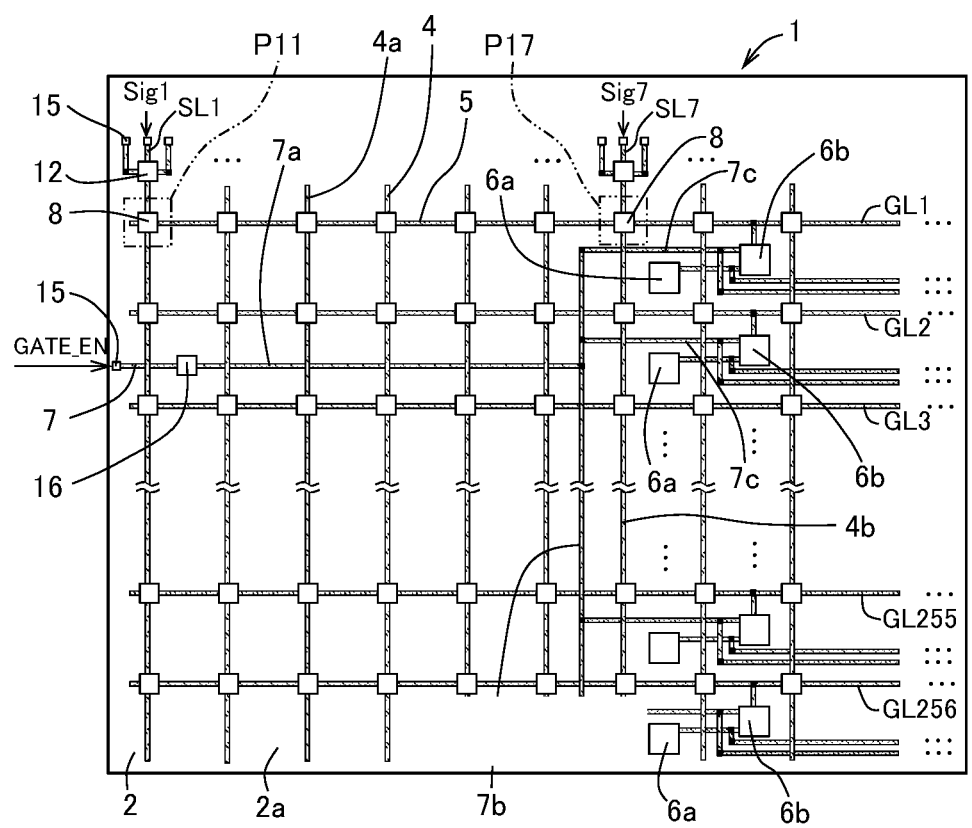
FIG. 3 is a plan view illustrating a wiring layout in the display device of the first embodiment.
Figure 4A:
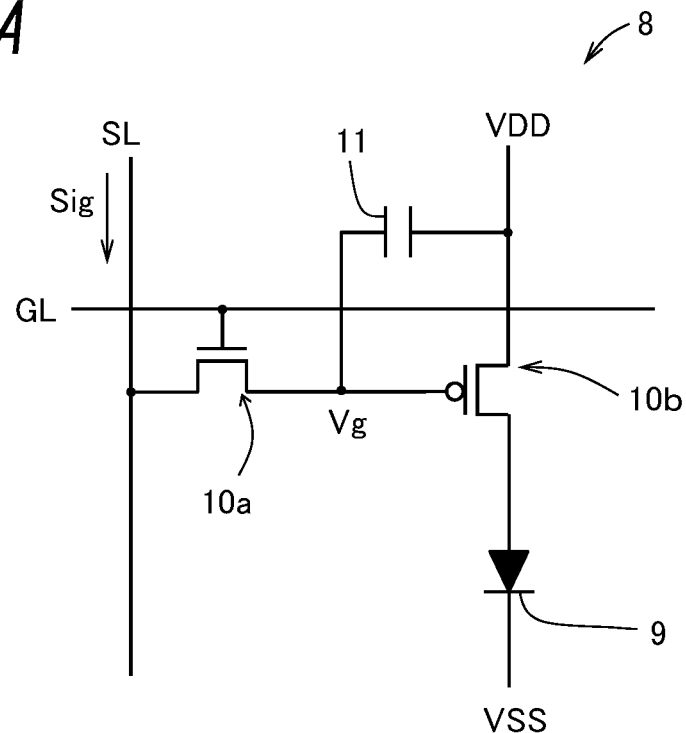
FIG. 4A is a circuit diagram illustrating an example of a light emitting unit.
Figure 4B:
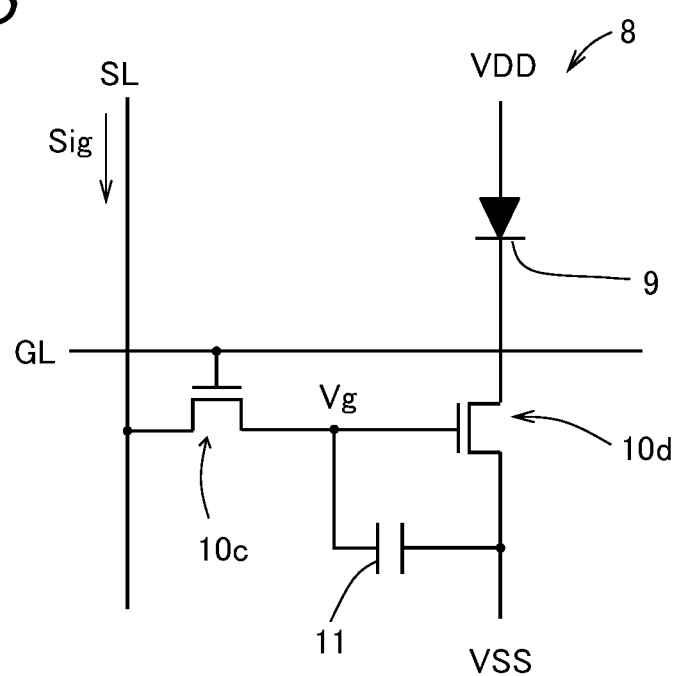
FIG. 4B is a circuit diagram illustrating another example of the light emitting unit.
Figure 4C:
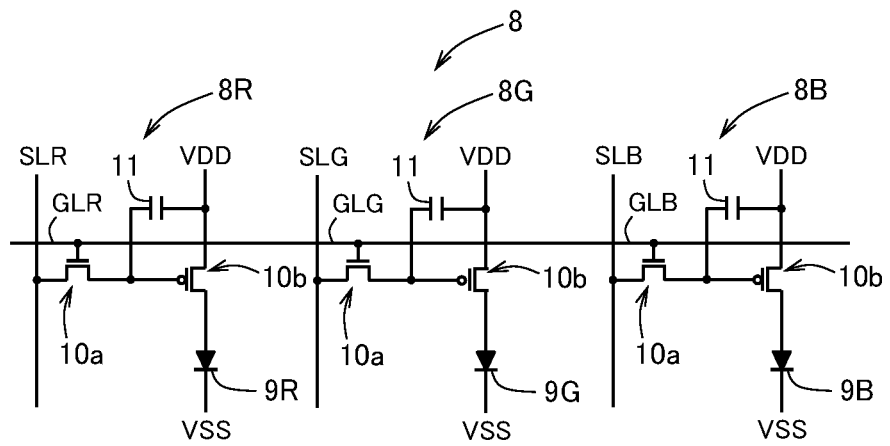
FIG. 4C is a circuit diagram illustrating still another example of the light emitting unit.
Figure 5A:
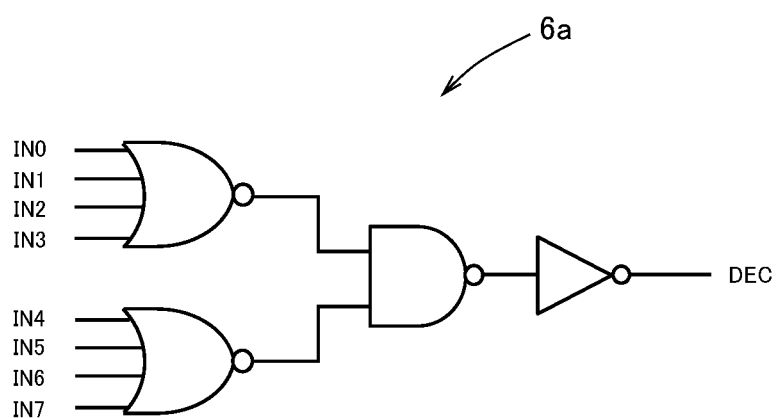
FIG. 5A is a circuit diagram illustrating an example of a scanning signal line address decoding circuit of a scanning signal line driving circuit.
Figures 5B, 5C:
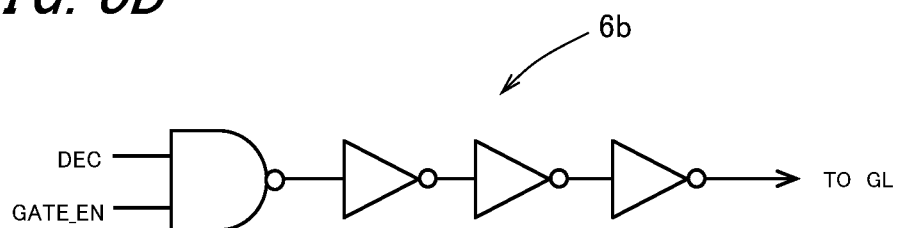
FIG. 5B is a circuit diagram illustrating an example of the scanning signal line driver circuit of the scanning signal line driving circuit.
FIG. 5C is a diagram illustrating a truth table of the scanning signal line address decoding circuit.

FIG. 1 is a diagram illustrating a schematic configuration of a display device of a first embodiment, FIG. 2 is a block circuit diagram illustrating a basic configuration of the display device of the first embodiment, and FIG. 3 is a plan view illustrating a wiring layout in the display device of the first embodiment. FIG. 4A is a circuit diagram illustrating an example of a light emitting unit, FIG. 4B is a circuit diagram illustrating another example of the light emitting unit, and FIG. 4C is a circuit diagram illustrating still another example of the light emitting unit. FIG. 5A is a circuit diagram illustrating an example of a scanning signal line address decoding circuit of a scanning signal line driving circuit, FIG. 5B is a circuit diagram illustrating an example of the scanning signal line driver circuit of the scanning signal line driving circuit, and FIG. 5C is a diagram illustrating a truth table of the scanning signal line address decoding circuit. In FIG. 3, wiring other than light emission control signal lines, scanning signal lines, and driving control signal lines is omitted, and the light emission control signal lines, the scanning signal lines, and the driving control signal lines are illustrated with hatching. Further, FIG. 3 illustrates a wiring layout when the wiring layer includes two layers. If the wiring layer includes three layers or more layers, the wiring layout thereof may be different from the wiring layout illustrated in FIG. 3. Signal lines placed on different wiring layers can be connected to each other, for example, via wiring interlayer contacts.

A display device 1 of the present embodiment includes a substrate 2, a pixel array 3, a plurality of light emission control signal lines 4, a plurality of scanning signal lines 5, a scanning signal line driving circuit 6, and a driving control signal line 7.

The substrate 2 is an insulating substrate such as a glass substrate and includes a first surface (one main surface) 2a and a second surface (the other main surface) 2b opposite to the first surface 2a. The pixel array 3, the light emission control signal lines 4, the scanning signal lines 5, the scanning signal line driving circuit 6, and the driving control signal line 7 are placed on the first surface 2a side of the substrate 2. The substrate 2 includes an image display section 2c on the first surface 2a side, and, for example, the pixel array 3, the scanning signal line driving circuit 6, and the driving control signal line 7 are placed in the image display section 2c as illustrated in FIG. 1.

The light emission control signal lines 4 and a driving element for driving the scanning signal lines 5 may be placed on the second surface 2b side of the substrate 2. The driving element may be mounted, for example, on the second surface 2b, by a method such as a COG (Chip On Glass) method. Instead of the driving element, a circuit board (Flexible Printed Circuit; FPC) for inputting and outputting driving signals of the light emission control signal lines 4 and the scanning signal lines 5 may be placed on the second surface 2b side of the substrate 2.

The pixel array 3 is configured so that a plurality of light emitting units (hereinafter, also referred to as pixels) 8 are placed on the first surface 2a side of the substrate 2 in a matrix of m rows and n columns (m and n are natural numbers). Each of the light emitting units 8 includes a light emitting element 9, a thin film transistor (TFT) 10, and a capacitive element 11. Hereinafter, a case where both of the number of rows m and the number of columns n of the pixel array 3 are 256 is described, but the number of rows m and the number of columns n of a pixel array may be a number other than 256. The number of rows m of the pixel array 3 and the number of columns n of the pixel array 3 may be different from each other.

As the light emitting element 9, for example, a light emitting diode (LED) can be used. The light emitting element 9 may be, for example, a microchip type LED or a monolithic type LED. The light emitting element 9 may be a self-luminous element and may be, for example, an organic electroluminescence (EL) element, an inorganic EL element, or a semiconductor laser element.

As illustrated in FIGS. 4A and 4B, in the display device 1 of the present embodiment, for example, each of the light emitting units 8 includes two TFTs 10a and 10b and one capacitive element 11. The TFTs 10a and 10b include, for example, a semiconductor film made of amorphous silicon, low-temperature polycrystalline silicon, or the like, and include three terminals which are a gate electrode, a source electrode, and a drain electrode. If the substrate 2 is a glass substrate, and the TFTs 10a and 10b include a semiconductor film made of low-temperature polycrystalline silicon, the TFT can be directly formed on the substrate 2 by a thin film forming method such as a Chemical Vapor Deposition (CVD) method. The TFTs 10a and 10b function as switching elements that allow the electric current to pass through the semiconductor film (channel) between the source electrode and the drain electrode by applying a voltage of a predetermined potential to the gate electrode.

The light emitting unit 8 illustrated in FIG. 4A includes the TFT 10a as an n-channel type TFT and the TFT 10b as a p-channel type TFT. The TFT 10a receives an input of a high-level signal to the gate electrode so that a portion between the source electrode and the drain electrode becomes conductive and the TFT 10a becomes in the ON state, which allows the electric current to flow. The TFT 10a is used as a switch element for inputting a light emission signal to the light emitting element 9. If the TFT 10a is turned on, a level (voltage) of a light emission control signal (hereinafter, also referred to as an image signal) Sig which is a signal that is transmitted by the light emission control signal lines 4 is written to a pixel node Vg. The TFT 10b receives an input of a low-level signal to the gate electrode so that a portion between the source electrode and the drain electrode becomes conductive and the TFT 10b is in the ON state, which allows the electric current to flow. The TFT 10b is used as a driving element for driving the electric current of the light emitting element 9 based on the potential difference (light emission signal) between the positive voltage (about 3 V to 5 V: VDD) and the negative voltage (about −3 V to 0 V: VSS) according to the level (voltage) of the light emission control signal Sig. The TFT 10b receives an input of the light emission control signal to the gate electrode so that the potential difference (light emission signal) according to the level of the light emission control signal is applied to the positive electrode (anode electrode) and the negative electrode (cathode electrode) of the light emitting element 9. The capacitive element 11 is placed in the connecting line that connects the gate electrode and the source electrode of the TFT 10b. The capacitive element 11 functions as a holding capacitance that holds the voltage of the light emission control signal inputted to the gate electrode of the TFT 10*b* for the period (period of one frame) until the next rewrite.

FIG. 4A illustrates an example in which each of the light emitting units 8 is configured to include the n-channel type TFT 10*a* and the p-channel type TFT 10*b*. However, each of the light emitting units 8 may be configured to include, for example, two n-channel type TFTs 10*c* and 10*d* as illustrated in FIG. 4B. Also, although not illustrated, each of the light emitting units 8 may be configured to include two p-channel type TFTs.

FIGS. 4A and 4B illustrate an example in which each of the light emitting units 8 is configured to include one light emitting element 9. However, as illustrated in FIG. 4C, each of the light emitting units 8 may be configured to include a sub light emitting unit 8R for red light emission, a sub light emitting unit 8G for green light emission, and a sub light emitting unit 8B for blue light emission. The sub light emitting unit 8R for red light emission may include a red light emitting element 9R made of red LED or the like, the sub light emitting unit 8G for green light emission may include a green light emitting element 9G made of green LED or the like, and the sub light emitting unit 8B for blue light emission may include a blue light emitting element 9B made of blue LED or the like. This makes the display device capable of the full-color display. Further, each of the light emitting units 8 may include, for example, a sub light emitting unit for white light emission, a sub light emitting unit for yellow light emission, and the like in addition to the sub light emitting unit 8R for red light emission, the sub light emitting unit 8G for green light emission, and the sub light emitting unit 8B for blue light emission. If each of the light emitting units 8 includes a sub light emitting unit for white light emission, the power consumption during the white light emission can be reduced compared with a case where white is expressed by using the sub light emitting units 8R, 8G, and 8B. If each of the light emitting units 8 includes a sub light emitting unit for yellow light emission, color rendering properties can be improved compared with a case where yellow is expressed by using the sub light emitting units 8R, 8G, and 8B.

FIG. 4C illustrates an example in which scanning signal lines GLR, GLG, and GLB of the sub light emitting unit 8R, 8G, and 8B are connected to each other. However, the scanning signal lines GLR, GLG, and GLB may be independently arranged. Otherwise, light emission control signal lines SLR, SLG, and SLB of the sub light emitting units 8R, 8G, and 8B may be connected, for example, to a time-division driving circuit that outputs a light emission control signal to the sub light emitting units 8R, 8G, and 8B via one light emission control signal line by time division.

The plurality of light emission control signal lines 4 (SL1, SL2, and the like) are placed on the first surface 2*a* side of the substrate 2 in each column of the pixel array 3. The light emission control signal lines 4 are connected to the image signal input terminal of the driving element. Each of the light emission control signal lines 4 supplies an image signal to the light emitting units 8 belonging to the column of the pixel array 3 where the light emission control signal lines 4 are arranged.

As illustrated in FIGS. 2 and 3, switching elements 12 may be connected to an input end portion of the light emission control signal line 4. As the switching elements 12, for example, a CMOS transfer gate element can be used. The CMOS transfer gate element is configured with the p-channel TFT and the n-channel TFT by connecting the source electrodes and connecting the drain electrodes. Each source electrode of the CMOS transfer gate element is connected to the image signal input terminal of the driving element via a side conductor formed on a side surface 2*d* of the substrate 2. Each drain electrode of the CMOS transfer gate element is connected to the light emission control signal line 4. The gate electrode of the p-channel TFT and the gate electrode of the n-channel TFT are set as the control input electrodes. If a low-level signal is inputted to the gate electrode of the p-channel TFT, and a high-level signal is inputted to the gate electrode of the n-channel TFT, the electric current flows between the source electrode and the drain electrode, and the image signal is inputted to the light emission control signal line 4.

The side conductor is made of a conductor material such as copper (Cu), aluminum (Al), silver (Ag), and molybdenum (Mo), and is placed on the side surface 2*d* that connects the first surface 2*a* and the second surface 2*b* of the substrate 2. Examples of the method of forming a side conductor include a method of forming a conductor film in a predetermined portion on the side surface 2*d* by a thin film forming method such as a plating method, a vapor deposition method, and a CVD method, a thick film forming method of applying and firing a conductor paste to a predetermined portion on the side surface 2*d* to manufacture a conductor layer, and a thick film forming method of forming a groove in a predetermined portion on the side surface 2*d* by an etching method or the like, then applying and firing a conductor paste to the groove to manufacture a conductor layer.

The plurality of scanning signal lines 5 (GL1, GL2, and the like) are arranged in each row of the pixel array 3 on the first surface 2*a* side of the substrate 2. The scanning signal lines 5 are connected to the scanning signal line driving circuit 6. Each of the scanning signal lines 5 supplies the scanning line driving signals to the light emitting units 8 belonging to the row of the pixel array 3 where the scanning signal lines 5 are arranged.

The scanning signal line driving circuit 6 includes a scanning signal line address decoding circuit (hereinafter, also referred to as a decoding circuit) 6*a*, and a scanning signal line driver circuit (hereinafter, also referred to as a driver circuit) 6*b*.

In the display device 1 of the present embodiment, one decoding circuit 6*a* is arranged in each row of the pixel array 3. For example, as illustrated in FIG. 5A, the decoding circuit 6*a* is configured with a negative logical sum (NOR) logical gate circuit. A scanning line selection signal generated by a driving element is inputted to the decoding circuit 6*a*.

If the number of rows of the pixel array 3 is 256, the scanning line selection signal may be, for example, eight signals selected from 16 signals of eight selection signals A0 to A7 and inversion selection signals XA0 to XA7 obtained by inverting the selection signals A0 to A7. The scanning line selection signal is generated by a driving element and is inputted to input units IN0 to IN7 of the decoding circuits 6*a* via eight signal lines among 16 scanning line selection signal lines 14 (GS0 to GS15). The decoding circuit 6*a* outputs a high-level signal if all of the eight input signals are low-level signals and outputs a low-level signal if at least one of the eight input signals is a high-level signal. The output signal DEC of the decoding circuit 6*a* is inputted to the driver circuit 6*b*.

The driver circuit 6*b* is placed after the decoding circuit 6*a*. The driver circuit 6*b* is configured with logical product (AND) logical gate circuits as illustrated in FIG. 5B. An output signal DEC of the decoding circuit 6*a* and a scanning line driving control signal (hereinafter, may also be referred to as driving control signals) GATE_EN generated by driving element are inputted to the driver circuit 6b. The driver circuit 6b outputs a high-level signal if both of the output signal DEC of the decoding circuit 6a and the driving control signal GATE_EN are high-level signals and outputs a low-level signal if at least one of the output signal DEC of the decoding circuit 6a and the driving control signal GATE_EN is the low-level signal. The output signals of the driver circuits 6b are inputted to the scanning signal lines 5 (GL1, GL2, and the like) in rows of the pixel array 3 where the driver circuits 6b are arranged.

According to the scanning signal line driving circuit 6 configured as above, there are $2^8=256$ combinations of the selection signals A0 to A7 and the inversion selection signals XA0 to XA7, and thus one of the scanning signal lines 5 (GL1, GL2, and the like) can be selected according to the selection signals A0 to A7 and the inversion selection signals XA0 to XA7 inputted to the scanning line selection signal lines GS0 to GS15. According to the truth table illustrated in FIG. 5C, eight of the selection signals A0 to A7 and the inversion selection signals XA0 to XA7 may be inputted to the decoding circuits 6a so that one of the scanning signal lines (selected GL) is selected.

In the decoding circuit 6a illustrated in FIG. 5A, the negative logical sum (NOR) logical gate circuit is configured with a plurality of negative logical sum (NOR) logical gate circuits connected in parallel, a negative logical product (NAND) logical gate circuit, and an inverter circuit that inverts the output of the negative logical product (NAND) logical gate circuit, to suppress the increase of the circuit scale (the number of gates). In the driver circuit 6b as illustrated in FIG. 5B, the logical product (AND) logical gate circuit is configured with a negative logical product (NAND) logical gate circuit and inverter circuits that invert the output of the negative logical product (NAND) logical gate circuit, to suppress the increase of the circuit scale (the number of gates).

In FIGS. 2 and 3, an example in which one driver circuit 6b is arranged in each row of the pixel array 3 is illustrated. However, the driver circuits 6b as illustrated in FIGS. 2 and 3, and other driver circuits configured in the same manner as the driver circuits 6b may be arranged in each row of the pixel array 3. For example, as illustrated in FIGS. 2 and 3, in the input unit of the driver circuit 6b, the driving control signal GATE_EN may be branched into two, so that one branch is inputted to the driver circuit 6b and the other is not inputted to the driver circuit 6b and propagates in the row direction of the pixel array 3. Further, in the input unit of the driver circuit 6b, the output signal DEC of the decoding circuit 6a may be branched into two, so that one branch is inputted to the driver circuit 6b and the other is not inputted to the driver circuit 6b and propagates in the row direction of the pixel array 3. The driving control signal GATE_EN and the output signals DEC of the decoding circuit 6a that are not inputted to the driver circuit 6b may be configured to be inputted to other driver circuits. According to such a configuration, the delay of the driving timing of the scanning signal line 5 in the row direction of the pixel array 3 can be suppressed.

The driving control signal line 7 is placed on the first surface 2a side of the substrate 2 and supplies the driving control signal GATE_EN generated by the driving element to the scanning signal line driver circuit 6b. The driving control signal line 7 is connected to a signal input pad 15 arranged in a peripheral region of the image display section 2c in the first surface 2a side of the substrate 2. The signal input pad 15 is connected to the driving element, for example, via the side conductor formed on the side surface 2d of the substrate 2. The signal input pad 15 may be connected to the driving element via a through conductor penetrating from the first surface 2a to the second surface 2b of the substrate 2. The driving control signal line 7 is provided with an electrostatic discharge protection circuit 16. As illustrated in FIG. 2, the electrostatic discharge protection circuit 16 may be provided, for example, near one end of the driving control signal line 7, which is connected to the signal input pad 15.

As illustrated in FIGS. 2 and 3, the driving control signal line 7 includes, for example, at least one first portion 7a, a second portion 7b, and a plurality of third portions 7c. The first portion 7a extends in the row direction of the pixel array 3. The second portion 7b is connected to the first portion 7a and extends in the column direction of the pixel array 3. The third portions 7c are connected to the second portion 7b and extend in the row direction of the pixel array 3. The third portion 7c extends in an opposite direction to the first portion 7a from the second portion 7b. In other words, the first portion 7a is a trunk line portion, the second portion 7b is a branch portion branched from the trunk line portion, and the third portion 7c is a branch line portion. In FIGS. 2 and 3, an example in which one third portion 7c is arranged in each pixel row of the pixel array 3 is illustrated. However, the driving control signal line 7 can be guided so that one third portion 7c is inputted to two or more driver circuits 6b. In this case, the number of the third portions 7c is smaller than the number of rows of the pixel array 3.

The light emission control signal line 4 includes at least one first light emission control signal line 4a and at least one second light emission control signal line 4b. The first light emission control signal line 4a and the second light emission control signal line 4b have different numbers of intersecting portions with the driving control signal line 7 in a plan view, and the number of intersecting portions of the first light emission control signal line 4a and the first portion 7a of the driving control signal line 7 is smaller than the number of intersecting portions of the second light emission control signal line 4b and the third portions 7c of the driving control signal line 7. That is, the light emission control signal line that intersects the first portion 7a which is the trunk line portions is the first light emission control signal line 4a, and the light emission control signal line that intersects the third portions 7c which are the branch line portions is the second light emission control signal line 4b. In other words, on the first surface 2a side of the substrate 2 in the display device 1 of the present embodiment, the wiring density of the driving control signal line 7 in the region adjacent to the first light emission control signal line 4a is lower than the wiring density of the driving control signal line in the region adjacent to the second light emission control signal line 4b.

According to the display device 1 of the present embodiment, the scanning signal line driving circuit 6 and the driving control signal line 7 that supplies the driving control signal GATE_EN to the scanning signal line driving circuit 6 can be placed in the image display section 2c and the scanning line selection signal lines GS0 to GS15 that supply the selection signals A0 to A7 and the inversion selection signals XA0 to XA7 to the scanning signal line driving circuit 6 can be placed on the first surface 2a side to be adjacent to pixel columns where the first light emission control signal lines 4a are arranged (for example, first to sixth columns of the pixel array 3 in the display device 1 illustrated in FIGS. 1 to 3). Accordingly, it is possible to make the display device 1 frameless.

The display device 1 includes N first light emission control signal lines 4a (N is a natural number) and the N first light emission control signal lines may be configured to be arranged in the first to N-th columns of the pixel array 3. According to the configuration, the wiring density in vicinity regions of the first to N-th columns of the pixel array 3 is lower than the wiring density in the vicinity regions other than the first to N-th columns. Accordingly, since the scanning line selection signal lines GS0 to GS15 can be arranged in the vicinity region of the first to N-th columns of the pixel array 3, together with connecting the scanning line selection signal lines GS0 to GS15 to the signal input pad 15 arranged in the peripheral region of the image display section 2c, the scanning line selection signal lines GS0 to GS15 can be easily guided. The signal input pad 15 is connected to the driving element, for example, via the side conductor formed on the side surface 2d of the substrate 2. The signal input pad 15 may be connected to the driving element via the through conductor penetrating from the first surface 2a to the second surface 2b of the substrate 2. The scanning line selection signal lines GS0 to GS15 are provided with the electrostatic discharge protection circuits 16, respectively. As illustrated in FIG. 2, the electrostatic discharge protection circuits 16 may be provided, for example, near one ends of the scanning line selection signal lines GS0 to GS15 connected to the signal input pad 15.

Figure 6:
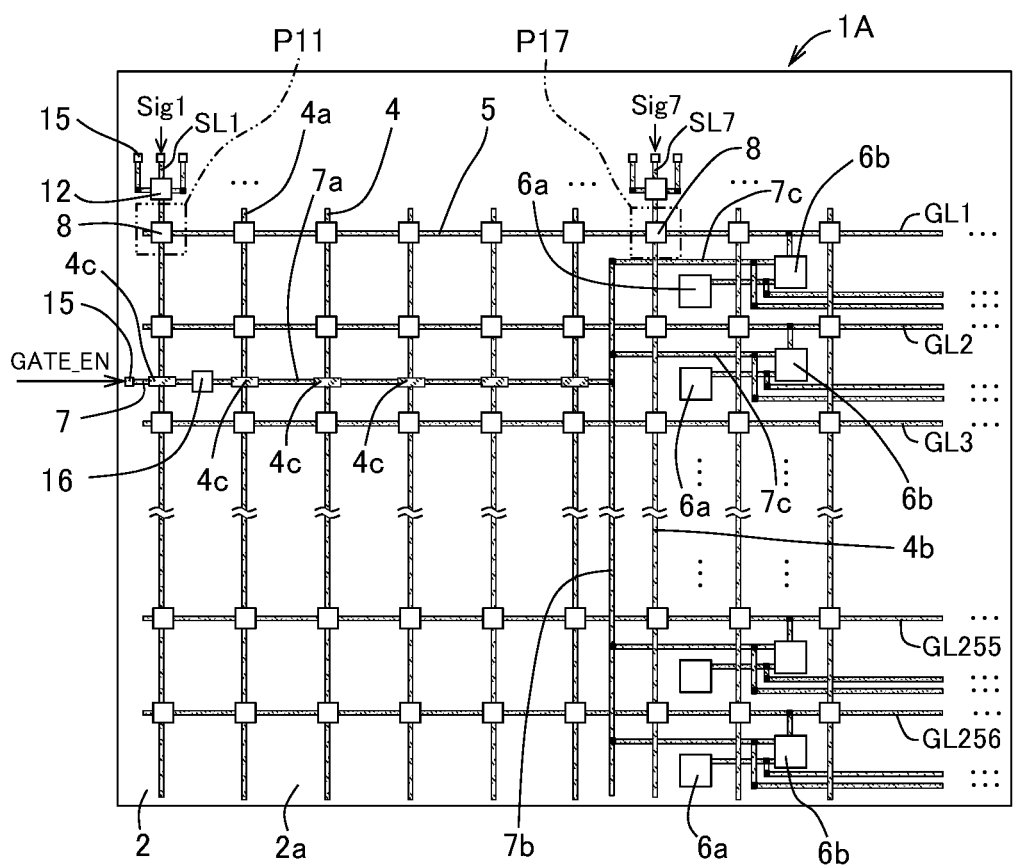
FIG. 6 is a plan view illustrating a wiring layout in a display device of a second embodiment.
Figure 7A:
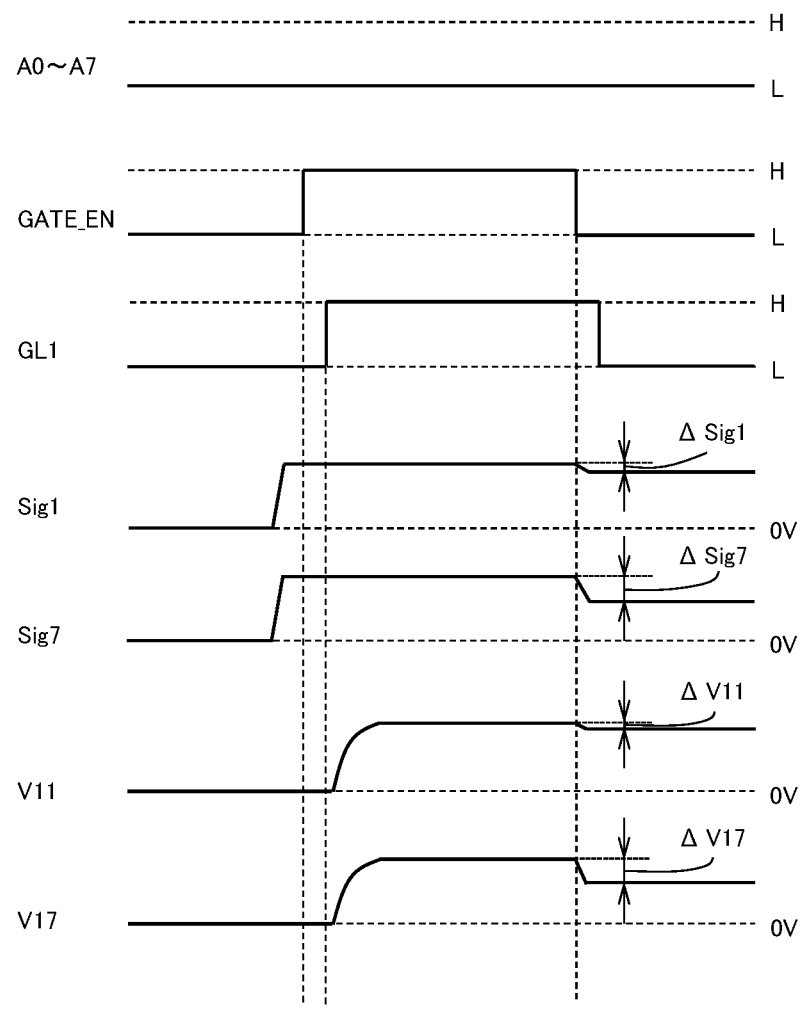
FIG. 7A is a signal waveform diagram illustrating the write operation in the display device of the first embodiment.
Figure 7B:
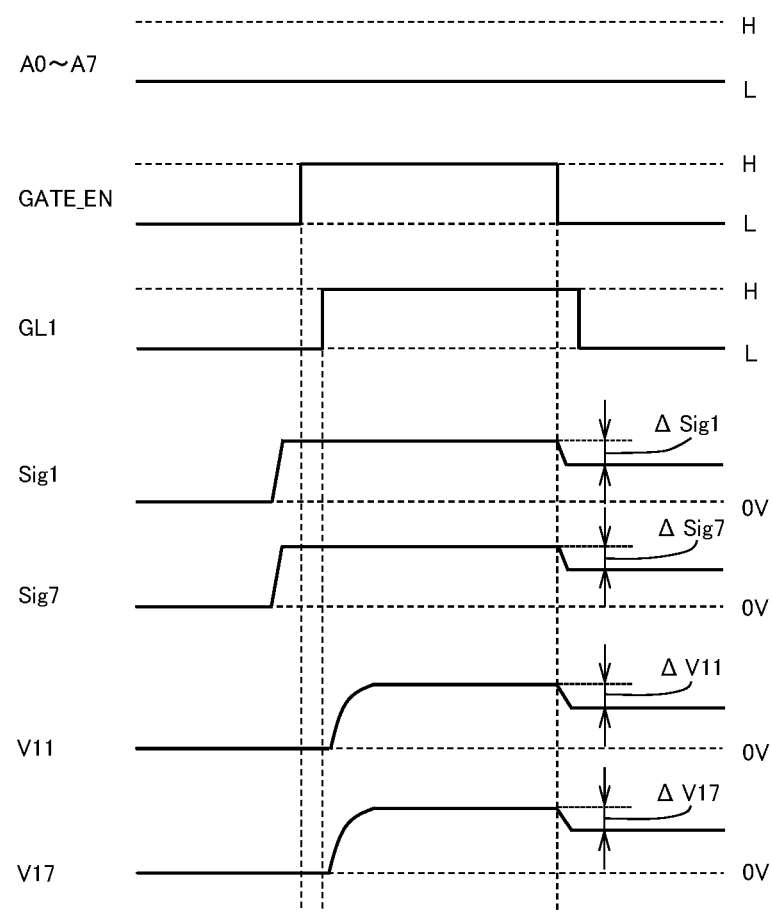
FIG. 7B is a signal waveform diagram illustrating the write operation in the display device of the second embodiment.

Subsequently, a display device according to a second embodiment is described. FIG. 6 is a plan view illustrating a wiring layout in the display device of the second embodiment, FIG. 7A is a signal waveform diagram illustrating the write operation in the display device of the first embodiment, and FIG. 7B is a signal waveform diagram illustrating the write operation in the display device of the second embodiment. In FIG. 6, wiring other than light emission control signal lines, scanning signal lines, and driving control signal lines is omitted, and the light emission control signal lines, the scanning signal lines, and the driving control signal lines are illustrated with hatching. Since a display device 1A of the second embodiment is different from the display device 1 of the first embodiment in the configuration of the first light emission control signal line 4a and the others have the same configurations, the same configurations are denoted by the same reference numerals as those in the display device 1 and the detailed descriptions thereof are omitted.

In the display device 1 of the first embodiment, the light emission control signal line 4 and the driving control signal line 7 are placed on the first surface 2a side of the substrate 2 and intersect each other in a plan view. The light emission control signal line 4 and the driving control signal line 7 are placed on a different wiring layer among the plurality of wiring layers included in the display device 1, and thus, the light emission control signal line 4 and the driving control signal line 7 are insulated from each other by an interlayer insulating film. Therefore, the portion where the light emission control signal line 4 and the driving control signal line 7 intersects each other in a plan view has a structure in which the light emission control signal line 4 and the driving control signal line 7 interpose the interlayer insulating film, and parasitic capacitance is generated. The display device 1 is different in the wiring layout of the driving control signal line 7 in the pixel column where a first light emission control signal line 4a is arranged and the pixel column where the second light emission control signal line 4b is arranged. Therefore, in the pixel column where the first light emission control signal line 4a is arranged and the pixel column where the second light emission control signal line 4b are arranged, the parasitic capacitances generated between the light emission control signal line 4 and the driving control signal line 7 are different. Accordingly, even if image signals of the same level are supplied to two of the light emission control signal lines 4 arranged respectively in the adjacent pixel columns of the pixel array 3, the difference between the pixel columns in the signal level written to the light emitting unit 8 is generated by the capacitance coupling via the parasitic capacitance between the light emission control signal line 4 and the driving control signal line 7. As a result, the driving electric current of the light emitting elements 9 are different between adjacent pixels, and streaky color unevenness extending along the pixel column may occur.

With reference to FIG. 7A, the write operation in the display device 1 of the first embodiment is described. FIG. 7A illustrates the operation of writing an image signal of the same level to the pixel on the first row and the first column (P11 illustrated in FIG. 3) and the pixel on the first row and the seventh column (P17 illustrated in FIG. 3) of the pixel array 3 in a state in which all of the selection signals A0 to A7 are in the low level, and the output of the decoding circuit 6a of the pixel array 3 which is arranged in the first row is in the high level. The operation of P11 is performed in substantially the same manner as in the pixels of the second to sixth columns in the first row of the pixel array 3. The operation of P17 is performed in substantially the same manner as in the pixels of the eighth column and the subsequent columns in the first row of the pixel array 3.

Image signals Sig1 and Sig7 of the same level are supplied to the light emission control signal line SL1 arranged in the first column of the pixel array 3 and the light emission control signal line SL7 arranged in the seventh column of the pixel array 3. In a state in which the output of the decoding circuit 6a arranged in the first row of the pixel array 3 is in the high level, if the driving control signal GATE_EN transitions from the low level to the high level, the scanning signal line GL1 is activated. If the scanning signal line GL1 is activated, the TFT 10a in each pixel of the first row of the pixel array 3 is in the ON state, potentials of the light emission control signal lines SL1 and SL7 are started to be written to the pixel nodes Vg of P11 and P17. Thereafter, if the driving control signal GATE_EN transitions from the high level to the low level and the scanning signal line GL1 is deactivated, the potentials of the pixel nodes Vg of P11 and P17 are held. However, when the driving control signal GATE_EN falls, the image signal Sig1 is pushed down by $\Delta\text{Sig1}$, and the image signal Sig7 is pushed down by $\Delta\text{Sig7}$ due to the capacitance coupling via parasitic capacitance between the light emission control signal line 4 and the driving control signal line 7. Further, according to the decreases of the image signals Sig1 and Sig7, a potential V11 of the pixel node Vg of P11 is pushed down by $\Delta\text{V11}$ and a potential V17 of the pixel node Vg of P17 is pushed down by $\Delta\text{V17}$. Here, the parasitic capacitance generated between the first light emission control signal line 4a and the driving control signal line 7 is smaller than the parasitic capacitance generated between the second light emission control signal line 4b and the driving control signal line 7, and thus $\Delta\text{Sig1}$ becomes smaller than $\Delta\text{Sig7}$. Accordingly, $\Delta\text{V11}$ is smaller than $\Delta\text{V17}$, and the potential held in the pixel node Vg of P11 is higher than the potential held in the pixel node Vg of P17. Accordingly, in P11 and P17, there is a difference in the driving electric current of the light emitting element 9 during the light emission period, and thus the brightness of the light emission of P11 becomes different from the brightness of the light emission of P17, which may be visually recognized as the color unevenness.

The color unevenness caused by the parasitic capacitance between the light emission control signal line 4 and the driving control signal line 7 described above can be offset by correcting in advance at least one of the light emission control signals Sig1 and Sig7 supplied to the light emission control signal lines SL1 and SL7, but a correction circuit, a correction process, or the like for correcting the light emission control signals is required. There is a concern in that such a correction circuit, a correction process, or the like cause the increase in the manufacturing cost of the display device, the increase in the power consumption of the display device, or the like. In the display device 1A of the second embodiment, the color unevenness is further suppressed without correcting the light emission control signals by changing the configuration of the light emission control signal line 4.

As illustrated in FIG. 6, in the display device 1A of the present embodiment, for example, the first light emission control signal line 4a is configured to include a first wide width portion 4c which is placed in the portion thereof that overlaps with the driving control signal line 7 in the plan view. According to the configuration, the parasitic capacitance between the first light emission control signal line 4a and the driving control signal line 7 can be increased to be closer to the parasitic capacitance between the second light emission control signal line 4b and the driving control signal line 7.

The first wide width portion 4c only needs to be in a shape that can increase the parasitic capacitance between the first light emission control signal line 4a and the driving control signal line 7, and the shape in a plan view may be, for example, a circular shape, a square shape, a rectangular shape, or may be any other shape. According to the present embodiment, the shape of the first wide width portion 4c in the plan view is set as a rectangular shape and the length direction of the first wide width portion 4c is set to be substantially the same as the row direction of the pixel array 3. Accordingly, the increase in the area of the first wide width portion 4c can be suppressed and the parasitic capacitance between the first light emission control signal line 4a and the driving control signal line 7 can be increased. If the plurality of first light emission control signal lines 4a are present, the shapes of the first wide width portions 4c formed on the plurality of first light emission control signal lines 4a may be different from each other.

FIG. 7B is a signal waveform diagram illustrating the write operation in the display device 1A of the second embodiment. In the waveform diagram illustrated in FIG. 7B, the selection signals A0 to A7, the scanning signal line GL1, and the driving control signal GATE_EN are the same as those in the waveform diagram illustrated in FIG. 7A and thus the descriptions thereof are omitted, and only the light emission control signals Sig1 and Sig7 and the potentials V11 and V17 of the pixel nodes Vg of the pixels P11 and P17 are described.

In the display device 1A of the present embodiment, the parasitic capacitance between the first light emission control signal line 4a and the driving control signal line 7 can be closer to the parasitic capacitance between the second light emission control signal line 4b and the driving control signal line 7. Therefore, as illustrated in FIG. 7B, the amount of ΔSig1 by which the light emission control signal Sig1 is pushed down when the driving control signal GATE_EN falls can be closer to the amount of ΔSig7 by which the light emission control signal Sig7 is pushed down. As a result, the amount of ΔV11 by which the pixel potential V11 is pushed down can be closer to the amount of ΔV17 by which the pixel potential V17 is pushed down. Accordingly, the driving electric current of the light emitting element 9 in P11 and P17 during the light emission period can be caused to be substantially the same, and thus the color unevenness can be suppressed. Accordingly, according to the display device 1A of the second embodiment, it is possible to make the display device frameless and the color unevenness can be suppressed.

Figure 8:
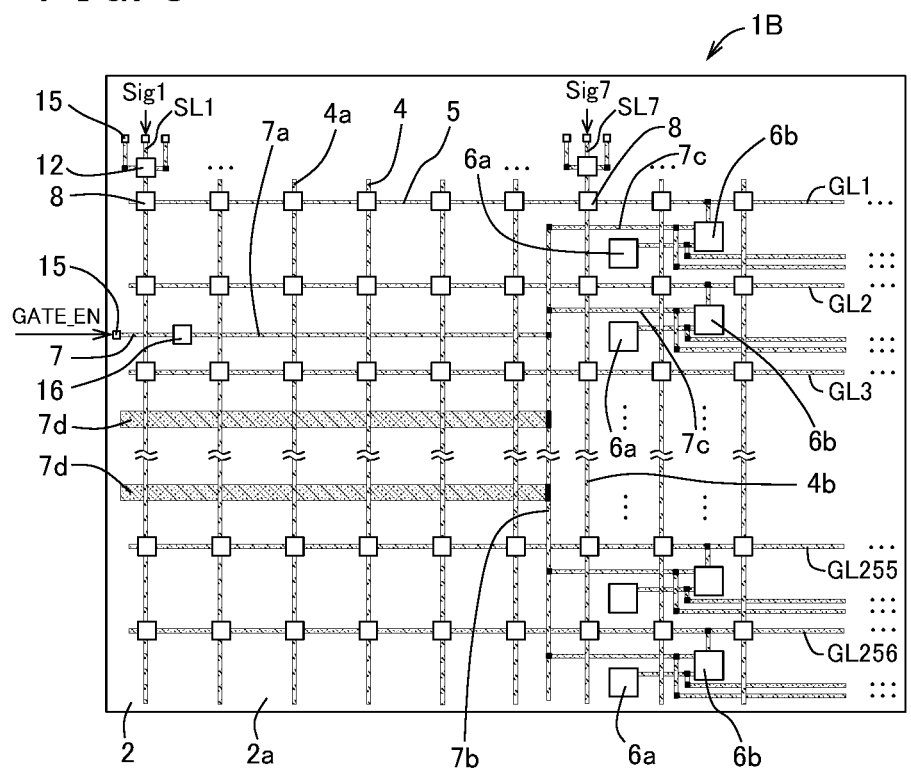
FIG. 8 is a plan view illustrating a wiring layout in a display device of a third embodiment.

Subsequently, a display device according to a third embodiment of the disclosure is described. FIG. 8 is a plan view illustrating a wiring layout in the display device of the third embodiment. In FIG. 8, wiring other than light emission control signal lines, scanning signal lines, and driving control signal lines is omitted, and the light emission control signal lines, the scanning signal lines, and the driving control signal lines are illustrated with hatching. A display device 1B of the third embodiment is different from the display device 1 of the first embodiment in that the driving control signal line includes a capacitance adjusting conductor and the others have the same configurations, and thus, the same configurations are denoted by the same reference numerals as in the display device 1 and the detailed descriptions thereof are omitted.

The display device 1B of the present embodiment is configured so that the driving control signal line 7 includes a capacitance adjusting conductor 7d. As illustrated in FIG. 8, for example, the capacitance adjusting conductor 7d is connected to the second portion 7b of the driving control signal line 7 and extends in the row direction of the pixel array 3. The capacitance adjusting conductor 7d extends on the same side as extension of the first portion 7a from the second portion 7b and intersects the first light emission control signal line 4a. According to such a configuration, the parasitic capacitance between the first light emission control signal line 4a and the driving control signal line 7 can be increased to be closer to the parasitic capacitance between the second light emission control signal line 4b and the driving control signal line 7. As a result, the color unevenness caused by the parasitic capacitance between the light emission control signal line 4 and the driving control signal line 7 can be suppressed. Therefore, according to the display device 1B of the present embodiment, it is possible to make the display device frameless and the color unevenness can be suppressed.

In FIG. 8, an example in which the width of the capacitance adjusting conductor 7d is larger than the width of the first portion 7a is illustrated. However, the width of the capacitance adjusting conductor 7d may be the same as the width of the first portion 7a or may be smaller than the width of the first portion 7a. In FIG. 8, an example in which two of the capacitance adjusting conductors 7d are arranged is illustrated. However, the number of the arranged capacitance adjusting conductors 7d may be only one or may be three or more. In FIG. 8, an example in which one end portion of the capacitance adjusting conductor 7d is connected to the second portion 7b and the other end portion is an open-end is illustrated. However, the driving control signal GATE_EN may be applied to the other end portion of the capacitance adjusting conductor 7d. Further, if the plurality of capacitance adjusting conductors 7d are arranged, the other end portions of the capacitance adjusting conductors 7d may be connected to each other. The plurality of capacitance adjusting conductors 7d may have different widths.

Figure 9:
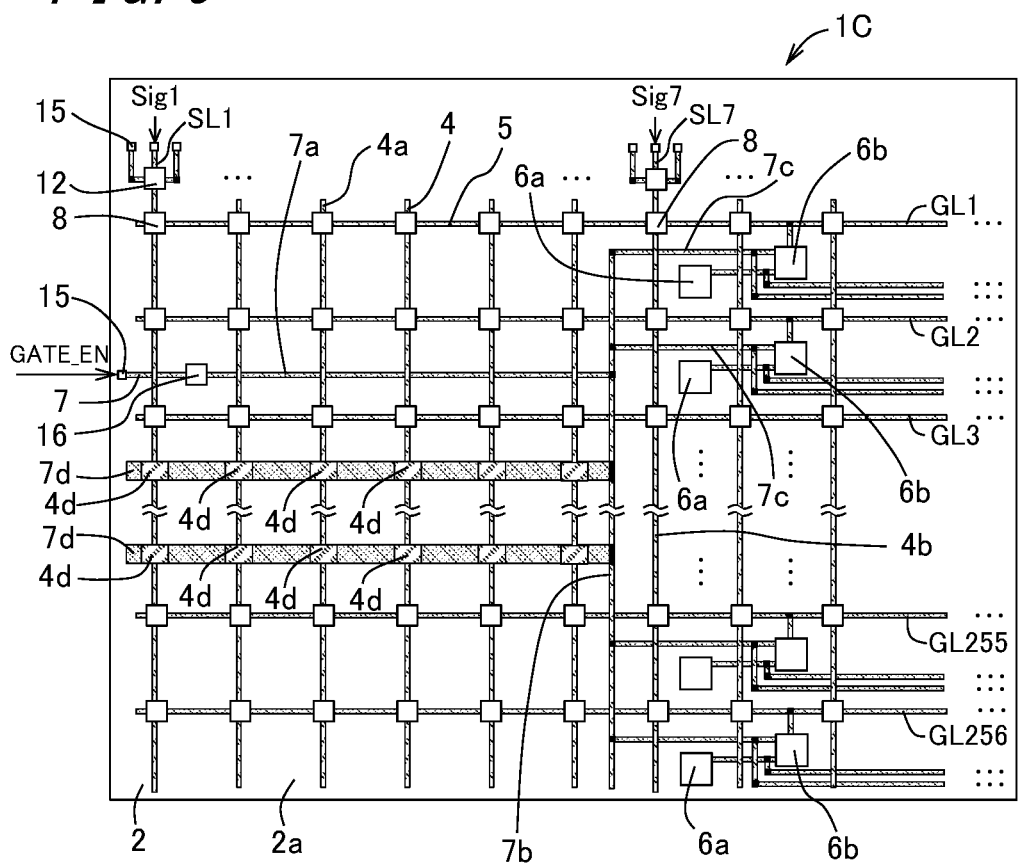
FIG. 9 is a plan view illustrating a wiring layout in a display device of a fourth embodiment.

Subsequently, a display device of a fourth embodiment of the disclosure is described. FIG. 9 is a plan view illustrating a wiring layout in the display device of the fourth embodiment. In FIG. 9, wiring other than light emission control signal lines, scanning signal lines, and driving control signal lines is omitted, and the light emission control signal lines, the scanning signal lines, and the driving control signal lines are illustrated with hatching. Since a display device 1C of the fourth embodiment is different from the display device 1B of the third embodiment in that the first light emission control line includes a second wide width portion and the others have the same configurations, the same configurations are denoted by the same reference numerals as those in the display device 1 and the detailed descriptions thereof are omitted.

As illustrated in FIG. 9, for example, the display device 1C of the present embodiment is configured to include a second wide width portion 4d which is placed in the portion where the first light emission control signal line 4a overlaps with the capacitance adjusting conductor 7d in a plan view. According to the configuration, the parasitic capacitance between the first light emission control signal line 4a and the driving control signal line 7 can be increased. Accordingly, the color unevenness caused by the parasitic capacitance between the light emission control signal line 4 and the driving control signal line 7 can be suppressed. If the width of the capacitance adjusting conductor 7d is larger than the width of the first portion 7a, the parasitic capacitance generated between the second wide width portions 4d and the capacitance adjusting conductors 7d can be effectively increased. Accordingly, the color unevenness caused by the parasitic capacitance between the light emission control signal lines 4 and the driving control signal line 7 can be effectively suppressed.

In FIG. 9, although a case where a plurality of second wide width portions 4d have the same shape is illustrated, the plurality of second wide width portions 4d may have different shapes. In FIG. 9, an example in which two capacitance adjusting conductors 7d are arranged is illustrated. However, the number of the arranged capacitance adjusting conductors 7d may be only one or may be three or more. In FIG. 9, an example in which one end portion of the capacitance adjusting conductor 7d is connected to the second portion 7b and the other end portion is an open-end is illustrated. However, the driving control signal GATE_EN may be applied to the other end portion of the capacitance adjusting conductors 7d. Further, if a plurality of capacitance adjusting conductors 7d are arranged, the other end portions of the capacitance adjusting conductors 7d may be connected to each other. The plurality of capacitance adjusting conductors 7d may have widths different from each other.

Figure 10:
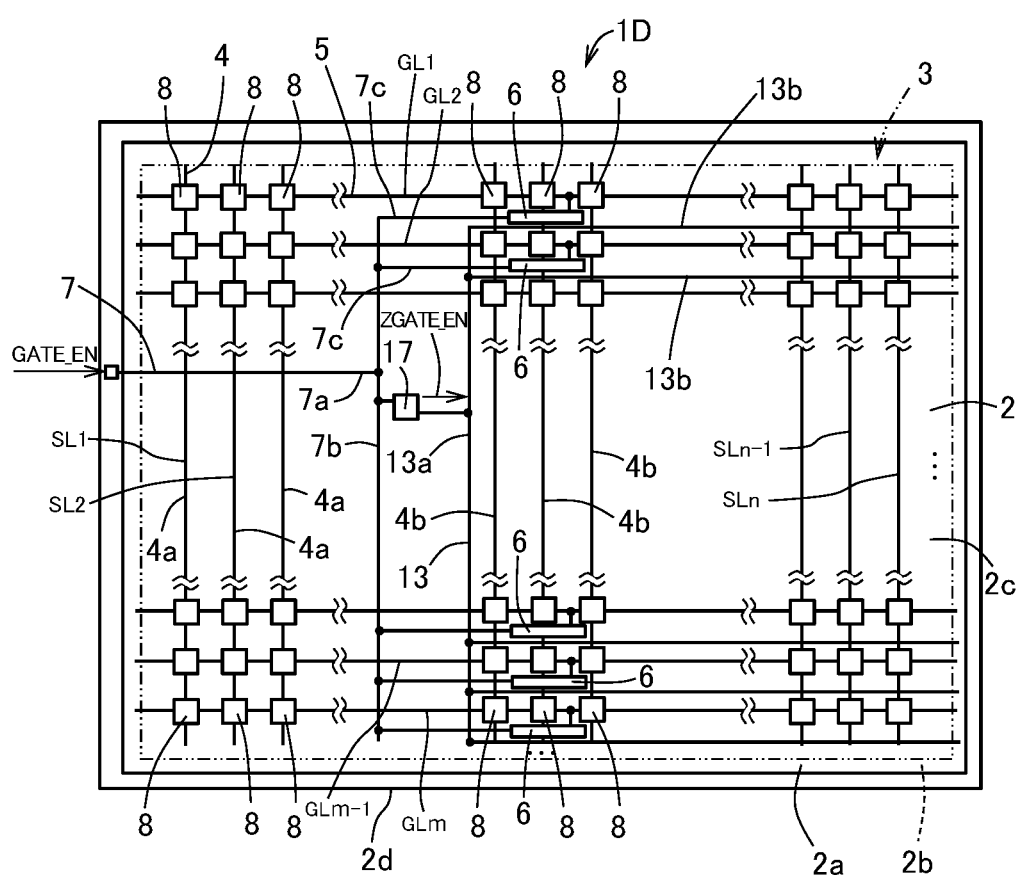
FIG. 10 is a diagram illustrating a schematic configuration of a display device of a fifth embodiment.
Figure 11:
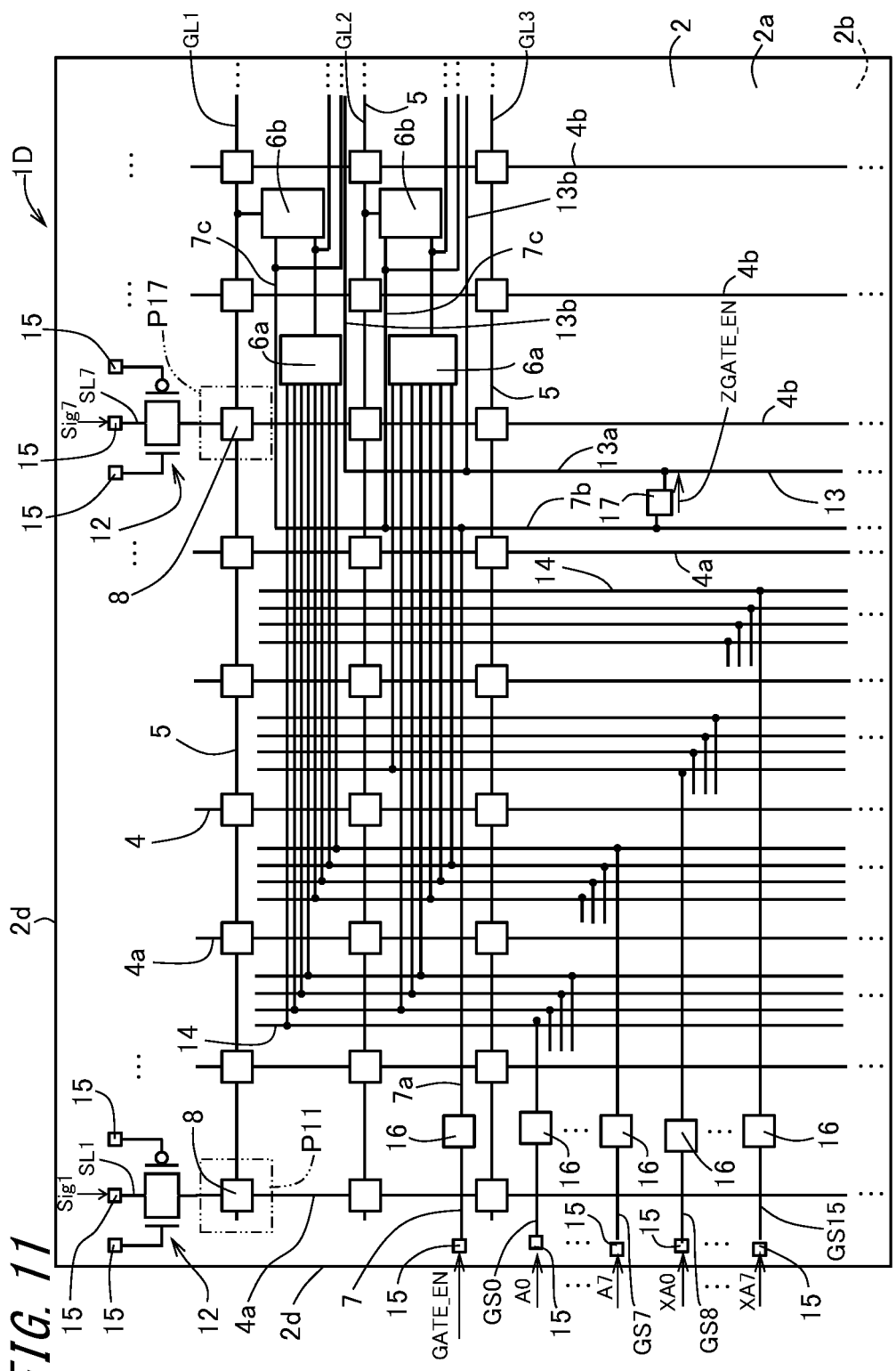
FIG. 11 is a block circuit diagram illustrating a basic configuration of the display device of the fifth embodiment.
Figure 12:
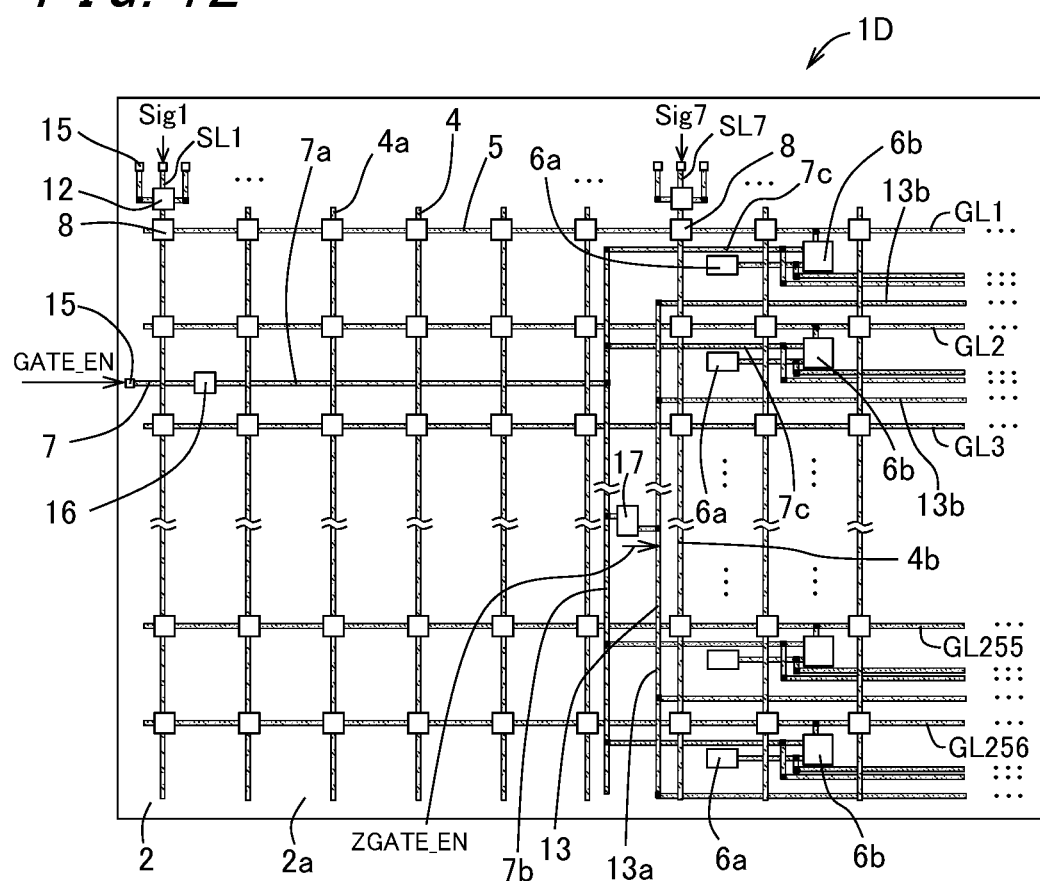
FIG. 12 is a plan view illustrating a wiring layout in the display device of the fifth embodiment.
Figure 13A:
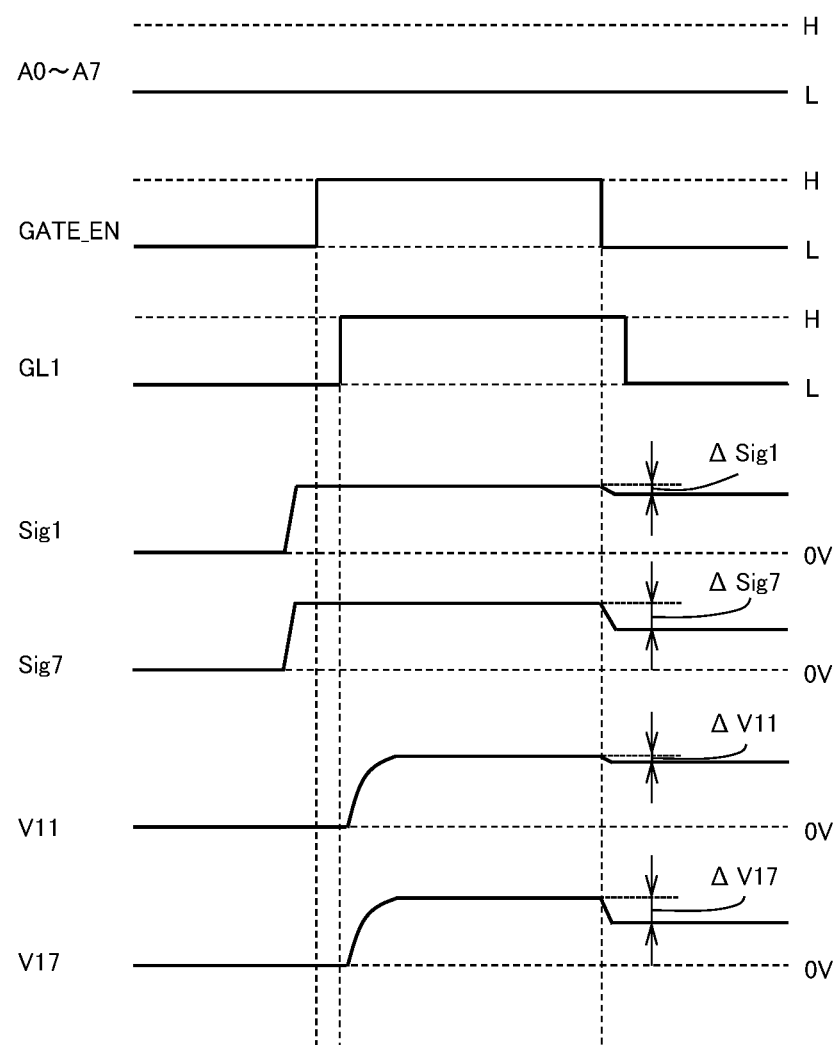
FIG. 13A is a signal waveform diagram illustrating the write operation of a display device of a comparative example.
Figure 13B:
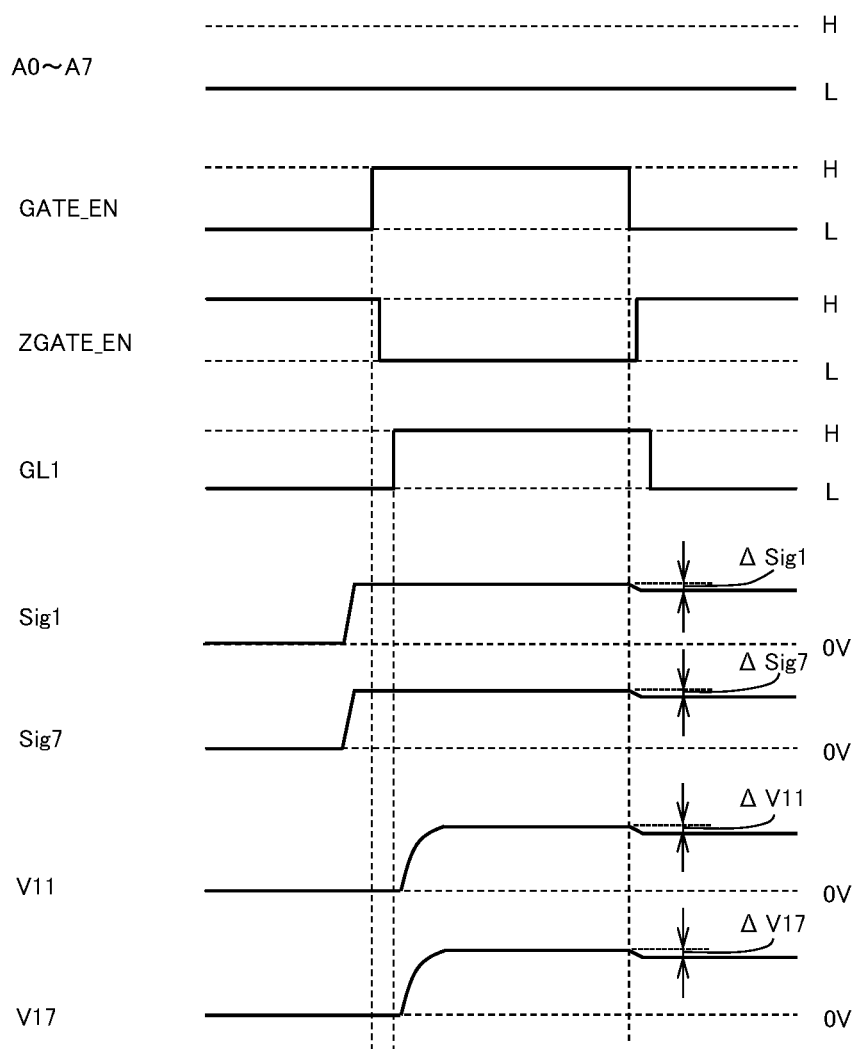
FIG. 13B is a signal waveform diagram illustrating the write operation in the display device of the fifth embodiment.
Figure 14:
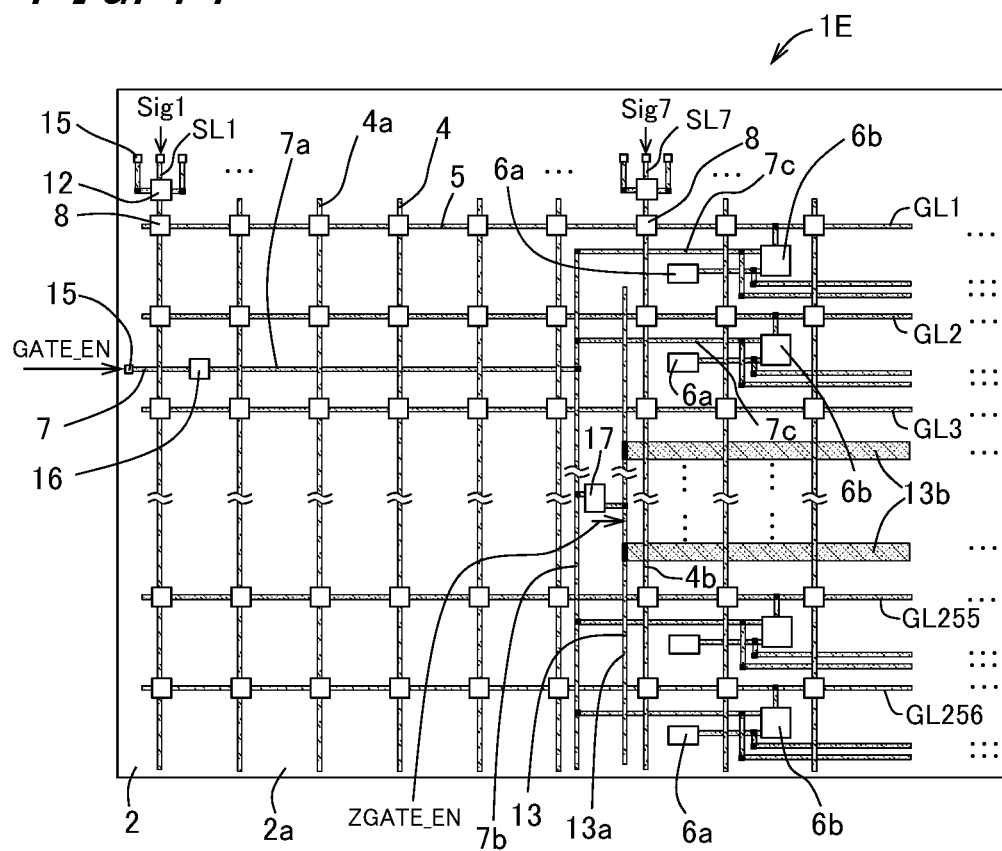
FIG. 14 is a plan view illustrating a wiring layout of a modification of the fifth embodiment.

FIG. 10 is a diagram illustrating a schematic configuration of a display device of a fifth embodiment, FIG. 11 is a block circuit diagram illustrating a basic configuration of the display device of the fifth embodiment, and FIG. 12 is a plan view illustrating a wiring layout in the display device of the fifth embodiment. FIG. 13A is a signal waveform diagram illustrating the write operation of a display device of a comparative example, and FIG. 13B is a signal waveform diagram illustrating the write operation in the display device of the fifth embodiment. FIG. 14 is a plan view illustrating a wiring layout of a modification of the fifth embodiment. In the present embodiment, the same configurations as those in the above embodiments are denoted by the same reference numerals and the detailed descriptions thereof are omitted. In FIG. 12, wiring other than light emission control signal lines, scanning signal lines, and driving control signal lines are omitted, and the light emission control signal lines, the scanning signal lines, the driving control signal lines, and the adjustment signal lines are illustrated with hatching.

FIG. 12 illustrates a wiring layout in a case where the wiring layer includes two layers. If there are three or more wiring layers, the wiring layout may be different from the wiring layout illustrated in FIG. 12. The signal lines placed on the different wiring layers can be connected to each other, for example, via a wiring interlayer contact.

A display device 1D of the present embodiment includes the substrate 2, the pixel array 3, the plurality of light emission control signal lines 4, the plurality of scanning signal lines 5, the scanning signal line driving circuit 6, the driving control signal line 7, and a compensation signal line 13.

The substrate 2 includes the image display section 2c on the first surface 2a side. As illustrated in FIG. 10, for example, the pixel array 3, the scanning signal line driving circuit 6, the driving control signal line 7, and the compensation signal line 13 are placed in the image display section 2c.

As illustrated in FIGS. 11 and 12, the switching element may be connected in the input end portion of the light emission control signal line 4.

In the display device 1D of the present embodiment, one decoding circuit 6a is arranged in each row of the pixel array 3.

In FIGS. 11 and 12, an example in which one driver circuit 6b is arranged in each row of the pixel array 3 is illustrated. However, the driver circuit 6b as illustrated in FIGS. 11 and 12 and other driver circuits configured in the same manner as in the driver circuit 6b may be arranged in each row of the pixel array 3. For example, as illustrated in FIGS. 11 and 12, in the input unit of the driver circuit 6b, the driving control signal GATE_EN may be branched into two so that one branch is inputted to the driver circuit 6b, and the other is not inputted to the driver circuit 6b and propagates in the row direction of the pixel array 3. Further, in the input unit of the driver circuit 6b, the output signal DEC of the decoding circuit 6a may be branched into two so that one branch is inputted to the driver circuit 6b, and the other is not inputted to the driver circuit 6b and propagates in the row direction of the pixel array 3. The driving control signal GATE_EN and the output signal DEC of the decoding circuit 6a that are not inputted to the driver circuit 6b may be configured to be inputted to the other driver circuits. According to such a configuration, the delay of the driving timing of the scanning signal line 5 in the row direction of the pixel array 3 can be suppressed.

For example, as illustrated in FIG. 11, the electrostatic discharge protection circuit 16 may be provided near one end of the driving control signal line 7 connected to the signal input pad 15.

For example, as illustrated in FIGS. 11 and 12, the driving control signal line 7 includes at least one first portion 7a, the second portion 7b, and the plurality of third portions 7c. The first portion 7a extends in the row direction of the pixel array 3. The second portion 7b is connected to the first portion 7a and extends in the column direction of the pixel array 3. The third portion 7c is connected to the second portion 7b and extends in the row direction of the pixel array 3. The third portion 7c extends in an opposite direction to the first portion 7a from the second portion 7b. In other words, the first portion 7a is a trunk line portion, the second portion 7b is a branch portion branched from the trunk line portion, and the third portion 7c is a branch line portion. In FIGS. 11 and 12, an example in which one third portion 7c is arranged in each pixel row of the pixel array 3 is illustrated. However, the driving control signal line 7 can be guided so that one third portion 7c is inputted to two or more driver circuits 6b. In this case, the number of third portions 7c is smaller than the number of rows of the pixel array 3.

According to the display device 1D of the present embodiment, the scanning signal line driving circuit 6 and the driving control signal line 7 that supplies the driving control signal GATE_EN to the scanning signal line driving circuit 6 are placed in the image display section 2c, the scanning line selection signal lines GS0 to GS15 that supply the selection signals A0 to A7 and the inversion selection signals XA0 to XA7 to the scanning signal line driving circuit 6 can be placed on the first surface 2a side to be adjacent to the pixel columns where the first light emission control signal lines 4a are arranged (for example, first to sixth columns of the pixel array in the display device 1D illustrated in FIGS. 10 to 12). Accordingly, the display device 1 can be made as a frameless display device.

The display device 1D may be configured so that N first light emission control signal lines 4a are present (N is a natural number) and N first light emission control signal lines are arranged in the first to the N-th columns of the pixel array 3. As illustrated in FIG. 11, the electrostatic discharge protection circuit 16 may be provided, for example, near one ends of the scanning line selection signal lines GS0 to GS15 which are connected to the signal input pad 15.

The display device 1D includes a plurality of wiring layers insulated from each other via interlayer insulating films. The light emission control signal line 4 and the driving control signal line 7 are placed on different wiring layers among the plurality of wiring layers. The portion in which the light emission control signal line 4 and the driving control signal line 7 intersect each other in a plan view has a structure in which the light emission control signal line 4 and the driving control signal line 7 interpose an interlayer insulating film to generate a parasitic capacitance. Therefore, the light emission control signal line 4 receives a coupling noise caused by the driving control signal GATE_EN due to the capacitance coupling by the parasitic capacitance generated in the intersecting portion of the light emission control signal line 4 and the driving control signal line 7. In the display device 1D, the number of intersecting portions of the first light emission control signal lines 4a and the driving control signal lines 7 is smaller than the number of intersecting portions of the second light emission control signal lines 4b and the driving control signal lines 7. Therefore, the coupling noise that is received by the first light emission control signal line 4a and is caused by the driving control signal GATE_EN is smaller than the coupling noise that is received by the second light emission control signal line 4b and is caused by the driving control signal GATE_EN. In the display device that does not include the configuration for reducing the difference between the coupling noises received by the first light emission control signal lines 4a and the second light emission control signal lines 4b, even if image signals of the same level (voltage) are inputted to the first light emission control signal line 4a and the second light emission control signal line 4b, the potentials written to the pixel nodes of the light emitting units 8 connected to the first light emission control signal lines 4a are different from the potentials written to the pixel nodes of the light emitting units 8 connected to the second light emission control signal lines 4b, due to the fluctuation of the levels of the image signals which is caused by the difference between the coupling noises. In this case, the driving electric current of the light emitting element is different in the light emitting unit 8 connected to the first light emission control signal lines 4a and in the light emitting unit 8 connected to the second light emission control signal lines 4b from each other, and thus the brightness of the light emission becomes different. As a result, the color unevenness may be generated in the displayed image.

The display device 1D of the present embodiment includes the compensation signal line 13 placed on the first surface 2a side of the substrate 2 as the configuration for reducing the difference between coupling noises received by the first light emission control signal line 4a and the second light emission control signal line 4b. As illustrated in FIGS. 10 to 12, the compensation signal line 13 includes, for example, a fourth portion 13a that extends in the column direction of the pixel array 3 and a plurality of fifth portions 13b that are connected to the fourth portion 13a and extend in the row direction of the pixel array 3. In the compensation signal line 13, the number of the intersecting portions of the first light emission control signal line 4a and the plurality of fifth portions 13b is smaller than the number of the intersecting portions of the second light emission control signal line 4b and the plurality of fifth portions 13b in a plan view.

A compensation signal for reducing the difference between coupling noises received by the first light emission control signal line 4a and the second light emission control signal line 4b is supplied to the compensation signal line 13. According to the present embodiment, as the compensation signal, an inversion signal ZGATE_EN of the driving control signal GATE_EN or a signal CTL_NZ with the opposite polarity to the driving control signal GATE_EN is used. The compensation signal may be supplied, for example, from an external driving element or a circuit board or may be generated in the display device 1D based on a signal supplied from the external driving element or the circuit board.

The compensation signal line 13 and the light emission control signal line 4 intersect each other in a plan view, and thus the capacitance coupling by the parasitic capacitance is generated in the intersecting portion of the light emission control signal line 4 and the compensation signal line 13. The compensation signal that is transmitted by the compensation signal line 13 affects the image signal that is transmitted by the light emission control signal line 4 via this capacitance coupling. Since the compensation signal is the inversion signal ZGATE_EN in which the driving control signals GATE_EN is inverted or the signal CTL_NZ that operates with the opposite polarity to the driving control signal GATE_EN, the compensation signal affects the light emission control signal line 4 to reduce the coupling noise that is received by the light emission control signal lines 4 and is caused by the driving control signal GATE_EN.

According to the present embodiment, the number of intersecting portions of the first light emission control signal lines 4a and the fifth portions 13b is smaller than the number of the intersecting portions of the second light emission control signal lines 4b and the fifth portions 13b in a plan view. Therefore, the influence on the second light emission control signal line 4b by the compensation signal is greater than the influence on the first light emission control signal line 4a by the compensation signal. Therefore, according to the display device 1D of the present embodiment, the difference between coupling noises received by the first light emission control signal line 4a and the second light emission control signal line 4b can be reduced, and the color unevenness of the displayed image can be suppressed.

As illustrated in FIGS. 11 and 12, the compensation signal line 13 may be configured so that the number of intersecting portions of the first light emission control signal lines 4a and the fifth portions 13b in a plan view is 0. According to such a configuration, the compensation signal does not substantially affect the image signal that is transmitted by the first light emission control signal line 4a but only affects the image signal that is transmitted by the second light emission control signal line 4b. Accordingly, the coupling noise that is received by the second light emission control signal line 4b and is caused by the driving control signal GATE_EN can be offset and the color unevenness of the displayed image can be suppressed.

If the inversion signal ZGATE_EN of the driving control signal GATE_EN is used as the compensation signal, the inversion signal ZGATE_EN may be generated by using an inverter circuit 17 that inverts the driving control signal GATE_EN. The inverter circuit 17 may be configured with, for example, a CMOS inverter. For example, as illustrated in FIGS. 10 to 12, the inverter circuit 17 may be placed in the image display section 2c so that an input unit is connected to the driving control signal line 7 and an output unit is connected to the compensation signal line 13. Accordingly, since the inversion signal ZGATE_EN can be generated in the image display section 2c, a signal line when the inversion signal ZGATE_EN is supplied from the outside can be omitted. In FIGS. 10 to 12, an example in which one inverter circuit 17 is arranged between the driving control signal line 7 and the compensation signal line 13 is illustrated. However, a plurality of inverter circuits 17 may be arranged between the driving control signal line 7 and the compensation signal line 13.

For example, as illustrated in FIG. 12, the driving control signal line 7 and the compensation signal line 13 are may be configured so that the number of the plurality of fifth portions 13b of the compensation signal line 13 is the same as the number of the plurality of third portions 7c of the driving control signal line 7, and the plurality of fifth portions 13b and the plurality of third portions 7c are alternately arranged in the column direction of the pixel array 3. According to such a configuration, the third portion 7c of the driving control signal line 7 and the fifth portion 13b of the compensation signal line 13 are arranged in pair, and thus the coupling noise that is received by the second light emission control signal line 4b and caused by the driving control signal GATE_EN transmitted by the third portions 7 can be effectively reduced by the influence of the compensation signal transmitted by the fifth portion 13b paired with the third portion 7c. Accordingly, the color unevenness of the displayed image can be effectively suppressed.

Subsequently, with reference to FIGS. 13A and 13B, the write operations of the image signals in the display device 1D of the present embodiment and the display device of the comparative example are described. FIG. 13A is a signal waveform diagram illustrating the write operation in the display device of the comparative example, and FIG. 13B is a signal waveform diagram illustrating the write operation in the display device of the fifth embodiment. Since the display device of the comparative example is different from the display device 1D illustrated in FIGS. 10 to 12, in that the compensation signal line 13 and the inverter circuit 17 are not provided, but the others have the same configurations, the same configurations are denoted by the same reference numerals as those in the display device 1D and the detailed descriptions thereof are omitted.

FIG. 13A illustrates the operation of writing an image signal of the same level to the pixel on the first row and the first column of the pixel array 3 (corresponding to P11 illustrated in FIG. 12) and the pixel on the first row and the seventh column (corresponding to P17 illustrated in FIG. 12) in a state in which all of the selection signals A0 to A7 are in the low level and the output of the decoding circuit 6a arranged in the first row of the pixel array 3 is the high level. The operation of P11 is substantially the same as the pixels in the second to sixth columns in the first row of the pixel array 3 and the operation of P17 is substantially the same as the pixels in the eighth column and the subsequent columns in the first row of the pixel array 3.

It is assumed that the image signals Sig1 and Sig7 of the same level are supplied to the light emission control signal line SL1 arranged in the first column of the pixel array 3 and the light emission control signal line SL7 arranged in the seventh column of the pixel array 3. If the driving control signal GATE_EN transitions from the low level to the high level in a state in which the output of the decoding circuit 6a arranged in the first row of the pixel array 3 is the high level, the scanning signal line GL1 is activated. If the scanning signal line GL1 is activated, the TFT 10a of each pixel in the first row of the pixel array 3 is in the ON state, and respective potentials of the light emission control signal lines SL1 and SL7 are started to be written to the pixel nodes Vg of P11 and P17. Thereafter, if the driving control signal GATE_EN transitions from the high level to the low level and the scanning signal line GL1 is deactivated, the potentials of the pixel nodes Vg of P11 and P17 are held. However, when the driving control signal GATE_EN falls, the image signal Sig1 is pushed down by ΔSig1, and the image signal Sig7 is pushed down by ΔSig7 due to the capacitance coupling via the parasitic capacitance between the light emission control signal line 4 and the driving control signal line 7. Further, the potential V11 of the pixel node Vg of P11 is pushed down by ΔV11, and the potential V17 of the pixel node Vg of P17 is pushed down by ΔV17, according to the decrease of the image signals Sig1 and Sig7. Here, since the parasitic capacitance generated between the first light emission control signal line 4a and the driving control signal line 7 is smaller than the parasitic capacitance generated between the second light emission control signal line 4b and the driving control signal line 7, ΔSig1 is smaller than ΔSig7. Accordingly, ΔV11 is smaller than ΔV17, and the potential held in the pixel node Vg of P11 is higher than the potential held in the pixel node Vg of P17. Therefore, in the display device of the comparative example, the driving electric current of the light emitting element 9 are different in P11 and P17 during the light emission period. As a result, the brightness of the light emission of P11 and the brightness of the light emission of P17 become different from each other and the color unevenness occurs in the displayed image.

FIG. 13B is a signal waveform diagram illustrating the write operation in the display device 1D of the present embodiment. In the signal waveform diagram illustrated in FIG. 13B, the operations of the selection signals A0 to A7, the scanning signal line GL1, and the driving control signal GATE_EN are the same as those in the signal waveform diagram illustrated in FIG. 13A, and thus the descriptions thereof are omitted, and only the light emission control signals Sig1 and Sig7 and the potentials V11 and V17 of the pixel nodes Vg of the pixels P11 and P17 are described.

In the display device 1D of the present embodiment, the capacitance coupling of the second light emission control signal line 4b and the driving control signal line 7 can be reduced by the compensation signal transmitted by the compensation signal line 13. As a result, the difference between the coupling noises in the first light emission control signal line 4a and the second light emission control signal line 4b can be reduced. Accordingly, in the display device 1D, ΔSig7 when the driving control signal GATE_EN falls can be closer to ΔSig1 when the driving control signal GATE_EN. As a result, ΔV17 when the driving control signal GATE_EN falls can be closer to ΔV11 when the driving control signal GATE_EN falls. Accordingly, during the light emission period of the display device 1, the driving electric current of the light emitting element 9 in P17 can be closer to the driving electric current of the light emitting element 9 in P11, and thus the color unevenness of the displayed image can be suppressed. Therefore, according to the display device 1D of the present embodiment, it is possible to provide a frameless display device in which the color unevenness of the displayed image can be suppressed.

Subsequently, the modification of the fifth embodiment is described. FIG. 14 is a plan view illustrating a wiring layout in the modification of the fifth embodiment. In FIG. 14, wiring other than light emission control signal lines, scanning signal lines, driving control signal lines, and a compensation signal line is omitted, and the light emission control signal lines, the scanning signal lines, the driving control signal lines and the compensation signal line are illustrated with hatching. Since a display device 1E of the present modification is different from the display device 1D of the fifth embodiment in the configuration of the compensation signal line 13 and the others have the same configurations, the same configurations are denoted by the same reference numerals as those in the display device 1D and the detailed descriptions thereof are omitted.

For example, as illustrated in FIG. 14, the display device 1E of the present modification is configured so that the number of the plurality of fifth portions 13b of the compensation signal line 13 is smaller than the number of the plurality of third portions 7c of the driving control signal line 7, and the line width of the plurality of fifth portions 13b is greater than the line width of the plurality of third portions 7c. According to such a configuration, compared with a case where the line width of the fifth portion 13b is equal to or smaller than the line width of the third portion 7c, the area where the fifth portions 13b and the second light emission control signal lines 4b are overlapped with each other increases and the parasitic capacitance generated between the fifth portion 13b and the second light emission control signal line 4b can be increased. Accordingly, by the fifth portions 13b with the number smaller than the number of the third portions 7c, the difference between the coupling noises received by the first light emission control signal line 4a and the second light emission control signal line 4b can be reduced. Therefore, according to the display device 1E of the modification, similar to the display device 1D of the fifth embodiment, it is possible to provide a frameless display device that can suppress the color unevenness. According to the display device 1E of the modification, the number of the plurality of fifth portions 13b of the compensation signal line 13 can be reduced, and thus wiring on the image display section 2c can be easily guided. In FIG. 14, an example in which the compensation signal line 13 includes two fifth portions 13b is illustrated. However, the compensation signal line 13 may include three or more fifth portions 13b.

Figure 15:
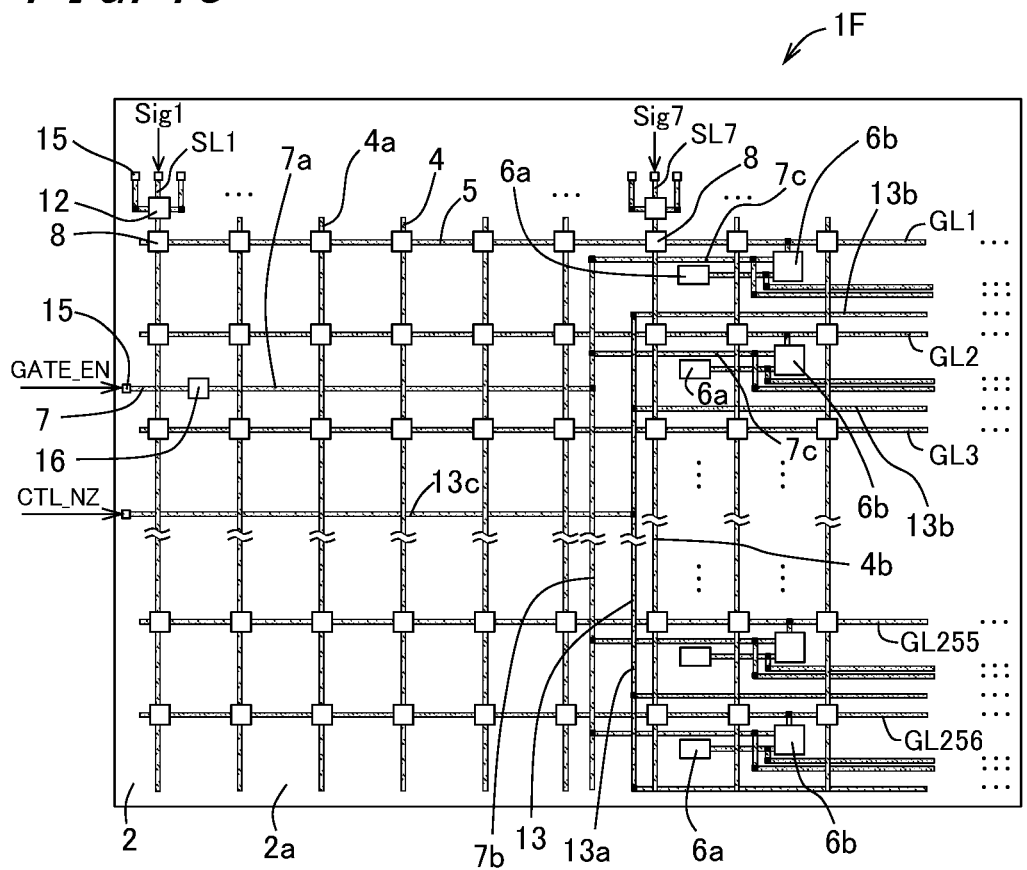
FIG. 15 is a plan view illustrating a wiring layout in a display device of a sixth embodiment.
Figure 16:
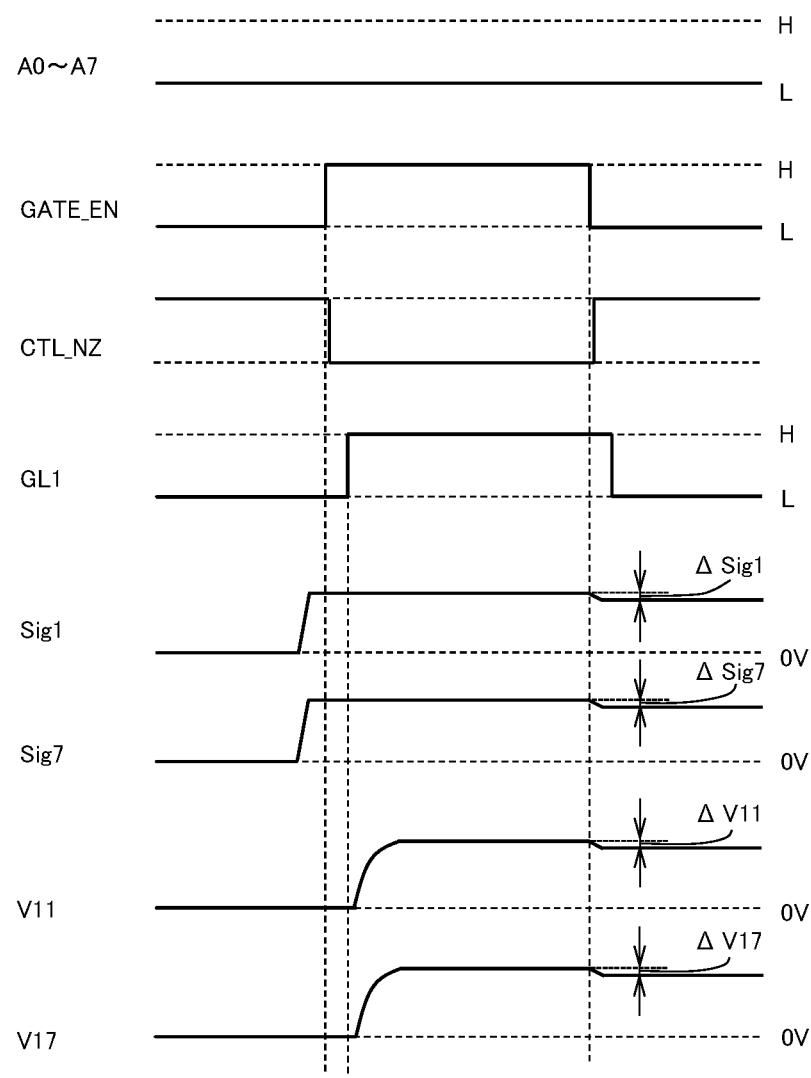
FIG. 16 is a signal waveform diagram illustrating the write operation in the display device of the sixth embodiment.

Subsequently, a display device of a sixth embodiment is described. FIG. 15 is a plan view illustrating a wiring layout in the display device of the sixth embodiment, and FIG. 16 is a signal waveform diagram illustrating the write operation in the display device of the sixth embodiment. In FIG. 15, wiring other than light emission control signal lines, scanning signal lines, a driving control signal line, and a compensation signal line is omitted, and the light emission control signal lines, the scanning signal lines, the driving control signal line, and the compensation signal line are illustrated with hatching. Since a display device 1F of the sixth embodiment is different from the display device 1D of the fifth embodiment in the configuration of the compensation signal line 13 and the others have the same configurations, the same configurations are denoted by the same reference numerals as those in the display device 1D and the detailed descriptions thereof are omitted.

In the display device 1F of the present embodiment, the compensation signal line 13 includes the fourth portion 13a that extends in the column direction of the pixel array 3, the plurality of fifth portions 13b that are connected to the fourth portion 13a and extend in the row direction of the pixel array 3, and a sixth portion 13c that is connected to the fourth portion 13a and extend from the fourth portion 13a in an opposite direction to the plurality of fifth portions 13b. In the compensation signal line 13, in a plan view, the number of intersecting portions of the first light emission control signal line 4a and the plurality of the fifth portion 13b is smaller than the number of the intersecting portions of the second light emission control signal line 4b and the plurality of fifth portions 13b.

The compensation signal for reducing the difference between coupling noises of the first light emission control signal line 4a and the second light emission control signal line 4b is supplied to the compensation signal line 13. In the present embodiment, the signal CTL_NZ with the opposite polarity to the driving control signal GATE_EN is used as the compensation signal. The compensation signal is supplied from the external driving element, the circuit board, or the like to the sixth portion 13c of the compensation signal line 13. The compensation signal is the signal CTL_NZ with the opposite polarity to the driving control signal GATE_EN, and thus affects the light emission control signal line 4 to reduce the coupling noises that are received by the light emission control signal line 4 and caused by the driving control signal GATE_EN.

As described above, according to the present embodiment, in a plan view, the number of intersecting portions of the first light emission control signal line 4a and the fifth portion 13b is smaller than the number of intersecting portions of the second light emission control signal line 4b and the fifth portion 13b. Accordingly, the influence on the second light emission control signal line 4b by the compensation signal is greater than the influence on the first light emission control signal line 4a by the compensation signal. Therefore, according to the display device 1F of the present embodiment, the difference between coupling noises received by the first light emission control signal line 4a and the second light emission control signal line 4b can be reduced, and further, the color unevenness of the displayed image can be suppressed.

The signal CTL_NZ with the opposite polarity to the driving control signal GATE_EN, which is used as the compensation signal, only needs to be a signal that operates in the opposite polarity to the driving control signal GATE_EN, and may be a signal with the positivity and negativity of the driving control signal GATE_EN reversed or may be a signal obtained by amplifying or attenuating the signal with the positivity and negativity of the driving control signal GATE_EN reversed to change the signal level. The rising timing of the compensation signal may be the same as or different from the rising timing of the driving control signal GATE_EN. The falling timing of the compensation signal may be the same as or different from the falling timing of the driving control signal GATE_EN. According to the present embodiment, the signal level, the rising and falling timing, and the like of the compensation signal can be set independently from the signal level, the rising and falling timing, and the like of the driving control signal GATE_EN. Accordingly, the level of the color unevenness can be adjusted from the outside by adjusting the signal level, the rising and falling timing, and the like of the compensation signal.

As illustrated in FIG. 15, the compensation signal line 13 may be configured so that the number of intersecting portions of the first light emission control signal line 4a and the fifth portion 13b is 0, in a plan view. According to such a configuration, the compensation signal does not substantially affect the image signal transmitted by the first light emission control signal line 4a, but only affects the image signal transmitted by the second light emission control signal line 4b. Accordingly, the coupling noise caused by the driving control signal GATE_EN received by the second light emission control signal line 4b can be offset, and further, the color unevenness of the displayed image can be suppressed.

For example, as illustrated in FIG. 15, the driving control signal line 7 and the compensation signal line 13 may have the configuration in which the number of the plurality of fifth portions 13b of the compensation signal line 13 is the same as the number of the plurality of third portions 7c of the driving control signal line 7, and the plurality of fifth portions 13b and the plurality of third portions 7c are alternately arranged in the column direction of the pixel array 3. According to such a configuration, since the third portions 7c of the driving control signal line 7 and the fifth portions 13b of the compensation signal line 13 are arranged in pair, the coupling noise that is received by the second light emission control signal line 4b and caused by the driving control signal GATE_EN transmitted by the third portions 7c can be effectively reduced by the influence of the compensation signal transmitted by the fifth portion 13b paired with the third portion 7c. Accordingly, the color unevenness of the displayed image can be effectively suppressed.

Subsequently, with reference to FIG. 16, the operation of writing an image signal in the display device 1F of the present embodiment is described. In the signal waveform diagram illustrated in FIG. 16, since the operations of the selection signals A0 to A7, the scanning signal line GL1, and the driving control signal GATE_EN are the same as that in the signal waveform diagram illustrated in FIGS. 13A and 13B, the descriptions thereof are omitted, and only the light emission control signals Sig1 and Sig7 and the potentials V11 and V17 of the pixel nodes of the pixels P11 and P17 are described.

In the display device 1F of the present embodiment, the capacitance coupling of the second light emission control signal line 4b and the driving control signal line 7 can be reduced by the compensation signal transmitted by the compensation signal line 13. As a result, the difference between the coupling noises in the first light emission control signal lines 4a and the second light emission control signal lines 4b can be reduced. Accordingly, in the display device 1F, ΔSig7 when the driving control signal GATE_EN falls can be closer to ΔSig1 when the driving control signal GATE_EN falls. As a result, ΔV17 when the driving control signal GATE_EN falls can be closer to ΔV11 when the driving control signal GATE_EN falls. Accordingly, during the light emission period of the display device 1F, the driving electric current of the light emitting element 9 in P17 can be closer to the driving electric current of the light emitting element 9 in P11, and thus the color unevenness of the displayed image can be suppressed. Therefore, according to the display device 1F of the present embodiment, it is possible to provide a frameless display device that can suppress the color unevenness of the displayed image.

Figure 17:
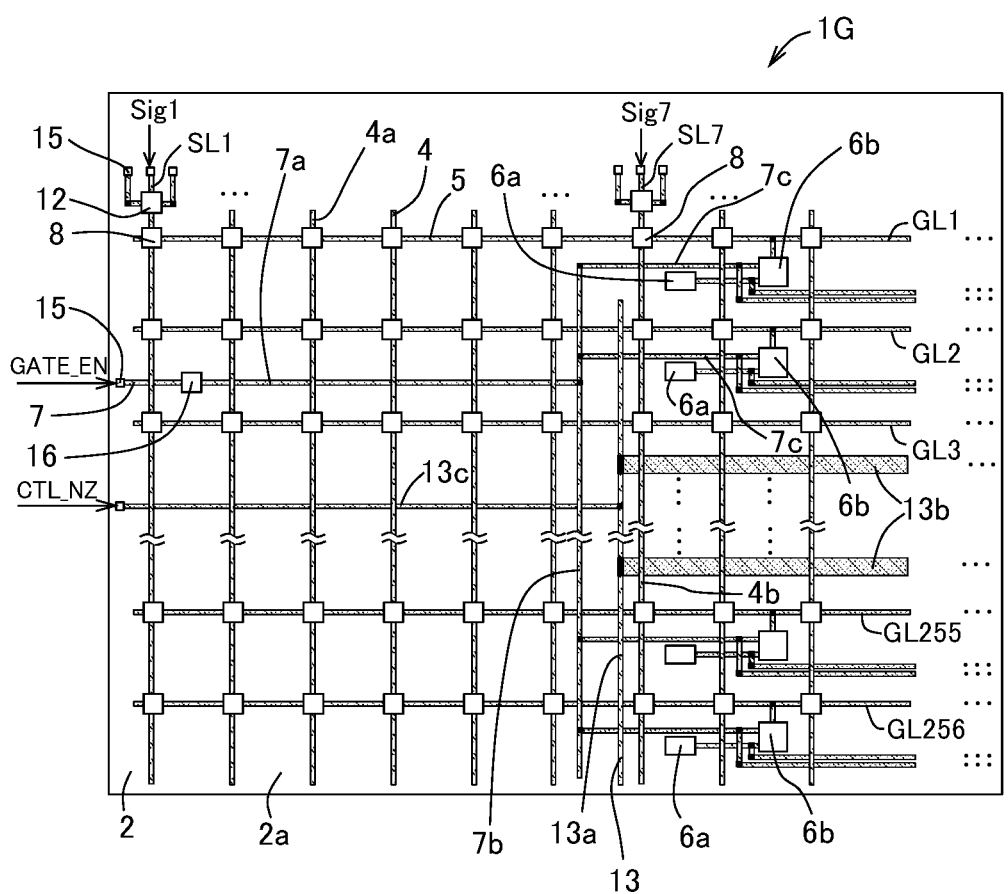
FIG. 17 is a plan view illustrating a wiring layout in a modification example of the sixth embodiment.

Subsequently, a modification of the display device of the sixth embodiment is described. FIG. 17 is a plan view illustrating the wiring layout in the modification example of the sixth embodiment. In FIG. 17, wiring other than light emission control signal lines, scanning signal lines, driving control signal lines, and a compensation signal line is omitted, and the light emission control signal lines, the scanning signal lines, the driving control signal lines, and the compensation signal line are illustrated with hatching. Since a display device 1G of the present modification is different from the display device 1F of the second embodiment in the configuration of the fifth portion 13b of the compensation signal line 13 and the others have the same configurations, the same configurations are denoted by the same reference numerals as those in the display device 1F and the detailed descriptions thereof are omitted.

For example, as illustrated in FIG. 17, the display device 1G of the present modification example is configured so that the number of the plurality of fifth portions 13b of the compensation signal line 13 is smaller than the number of the plurality of third portions 7c of the driving control signal line 7, and the line width of the plurality of fifth portions 13b is larger than the line width of the plurality of third portions 7c. According to such a configuration, compared with the case where the line width of the fifth portion 13b is equal to or smaller than the line width of the third portion 7c, the area where the fifth portion 13b and the second light emission control signal line 4b are overlapped with each other can be increased, and thus the parasitic capacitance generated between the fifth portion 13b and the second light emission control signal line 4b can be increased. Accordingly, by the fifth portions 13b with the number smaller than the number of the third portions 7c, the difference between the coupling noises in the first light emission control signal line 4a and the second light emission control signal line 4b can be reduced. Therefore, according to the display device 1G of the modification, a frameless display device that can suppress the color unevenness can be provided, similarly to the display device 1F of the sixth embodiment. According to the display device 1G of the modification, since the number of the plurality of fifth portions 13b of the compensation signal line 13 can be reduced, the wiring in the image display section 2c is easily guided. In FIG. 17, an example in which the compensation signal line 13 includes two fifth portions 13b is illustrated. However, the compensation signal line 13 may include three or more fifth portions 13b.

Figure 18:
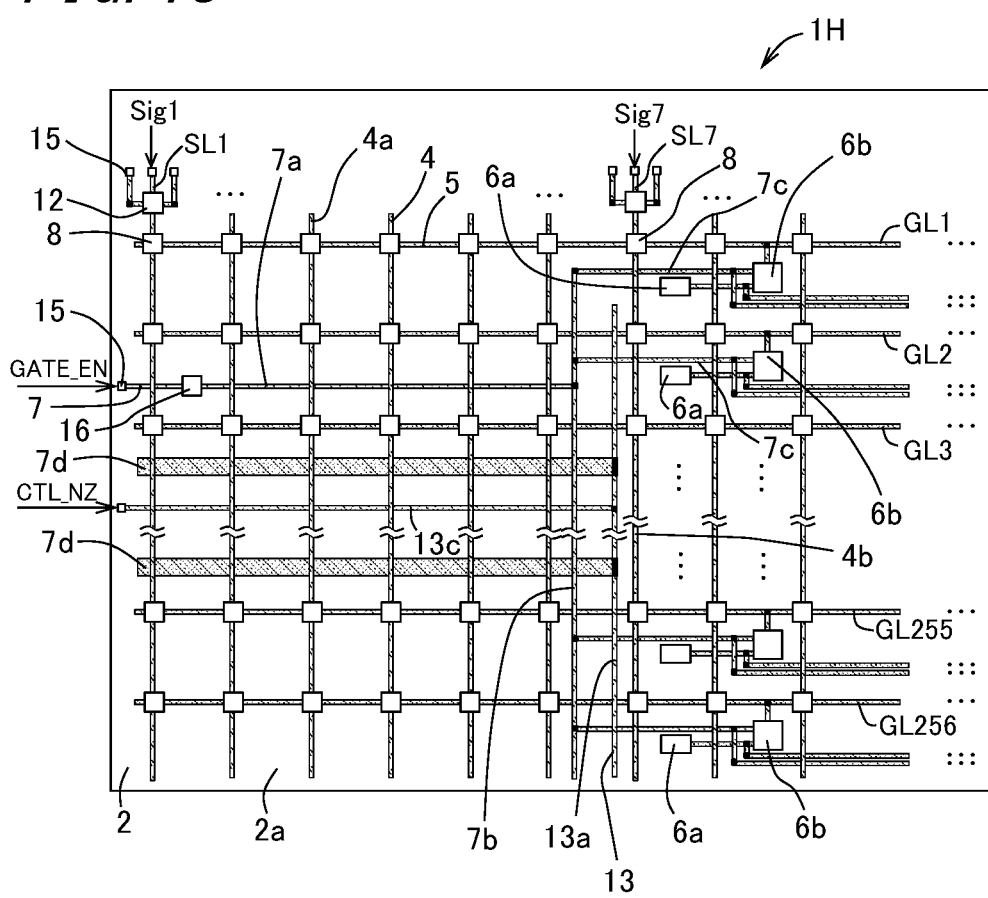
FIG. 18 is a plan view illustrating a wiring layout in a display device of a seventh embodiment.
Figure 19:
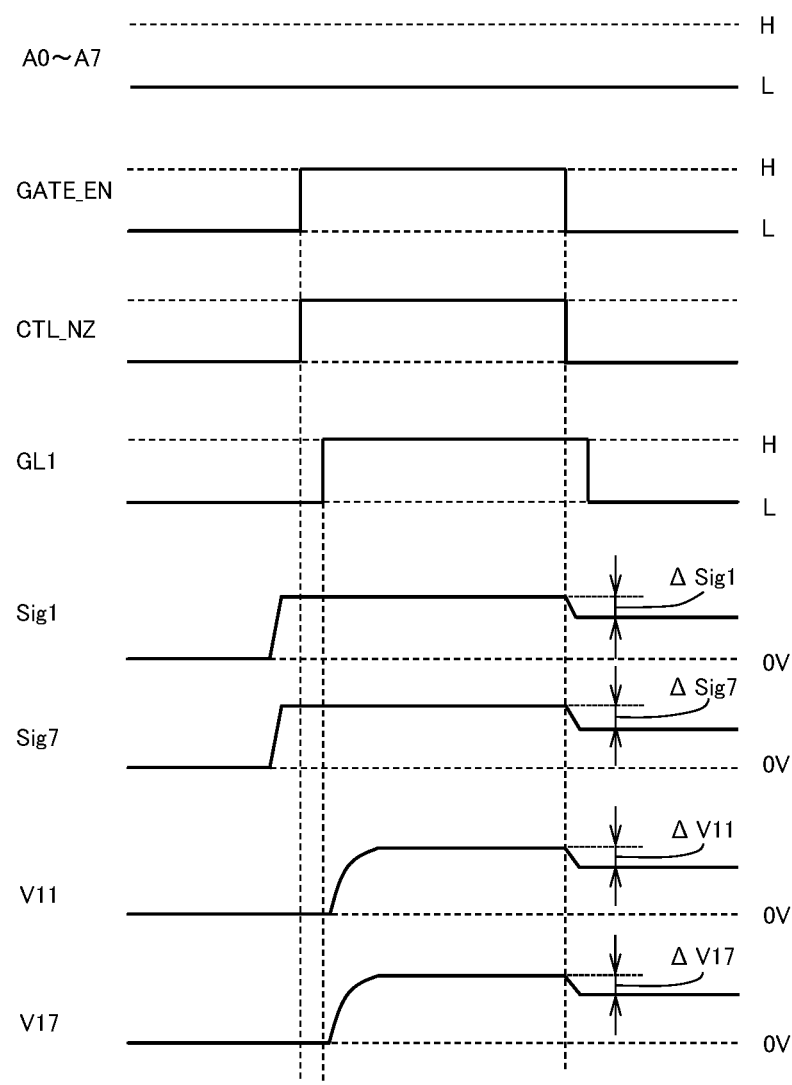
FIG. 19 is a signal waveform diagram illustrating the write operation in the display device according to the seventh embodiment.

Subsequently, a display device of a seventh embodiment is described. FIG. 18 is a plan view illustrating a wiring layout in the display device of the seventh embodiment, and FIG. 19 is a signal waveform diagram illustrating the write operation in the display device according to the seventh embodiment. In FIG. 18, wiring other than light emission control signal lines, scanning signal lines, driving control signal lines, and a compensation signal line is omitted, and the light emission control signal lines, the scanning signal lines, the driving control signal lines, and the compensation signal line are illustrated with hatching. Since a display device 1H of the seventh embodiment is different from the display device 1D of the fifth embodiment in the configuration of the compensation signal line 13 and the others have the same configurations, the same configurations are denoted by the same reference numerals as those in the display device 1D and the detailed descriptions thereof are omitted.

In the display device 1H of the present embodiment, the compensation signal line 13 includes the fourth portion 13a that extends in the column direction of the pixel array 3, the plurality of fifth portions 13b that are connected to the fourth portion 13a and extend in the row direction of the pixel array 3, and the sixth portion 13c that is connected to the fourth portion 13a and extend on the same side as extension of the plurality of fifth portions 13b from the fourth portion 13a. In a plan view, in the compensation signal line 13, the number of intersecting portions of the first light emission control signal line 4a and the fifth portion 13b is larger than the number of the intersecting portions of the second light emission control signal line 4b and the fifth portion 13b.

The compensation signal for reducing the difference between coupling noises in the first light emission control signal line 4a and the second light emission control signal line 4b is supplied to the compensation signal line 13. In the present embodiment, the signal CTL_NZ with the same polarity as that of the driving control signal GATE_EN is used as the compensation signal. The compensation signal is supplied from the external driving element, the circuit board, and the like to the sixth portion 13c of the compensation signal line 13.

The compensation signal line 13 and the light emission control signal line 4 intersect with each other in a plan view, and thus the capacitance coupling by the parasitic capacitance is generated in the intersecting portion of the light emission control signal line 4 and the compensation signal line 13. The compensation signal transmitted by the compensation signal line affects the image signal that is transmitted by the light emission control signal line 4 via this capacitance coupling. The compensation signal is the signal CTL_NZ that operates with the same polarity as that of the driving control signal GATE_EN, and thus affects the light emission control signal line 4 to increase the coupling noise that is received by the light emission control signal line 4 and caused by the driving control signal GATE_EN.

In the display device 1H, in a plan view, the number of the intersecting portions of the first light emission control signal line 4a and the fifth portion 13b is larger than the number of the second light emission control signal line 4b and the fifth portion 13b. Therefore, the influence on the first light emission control signal line 4a by the compensation signal is larger than the influence on the second light emission control signal line 4b by the compensation signal. Therefore, according to the display device 1H of the present embodiment, by the increase in the coupling noise received by the first light emission control signal line 4a, the difference between the coupling noises received by the first light emission control signal line 4a and the second light emission control signal line 4b can be reduced, and further, the color unevenness of the displayed image can be suppressed.

FIG. 19 is a signal waveform diagram illustrating the write operation in the display device 1H of the present embodiment. Since the operations of the selection signals A0 to A7, the scanning signal line GL1, and the driving control signal GATE_EN in the signal waveform diagram illustrated in FIG. 19 are the same as those in the signal waveform diagrams illustrated in FIGS. 13A, 13B, and 16, the descriptions thereof are omitted, and only the light emission control signals Sig1 and Sig7 and the potentials V11 and V17 of the pixel nodes of the pixels P11 and P17 are described.

In the display device 1H of the present embodiment, the capacitance coupling of the first light emission control signal line 4a and the driving control signal line 7 can be increased by the compensation signal transmitted by the compensation signal line 13. As a result, the difference between the coupling noises in the first light emission control signal line 4a and the second light emission control signal line 4b can be reduced. Accordingly, in the display device 1H, the amount of $\Delta Sig1$ by which the light emission control signal Sig1 is pushed down when the driving control signal GATE_EN falls can be closer to the amount of $\Delta Sig7$ by which the light emission control signal Sig7 is pushed down. As a result, the amount of $\Delta V11$ by which the pixel potential V11 is pushed down can be closer to $\Delta V17$ by which the pixel potential V17 is pushed down. Accordingly, during the light emission period of the display device 1H, the driving electric current of the light emitting element 9 in P11 can be closer to the driving electric current of the light emitting element 9 in P17, and thus the color unevenness of the displayed image can be suppressed. Therefore, according to the display device 1H of the present embodiment, it is possible to provide a frameless display device that can suppress the color unevenness of the displayed image.

The compensation signal may be a signal obtained by amplifying or attenuating the driving control signal GATE_EN to change a signal level (voltage). The rising timing of the compensation signal may be the same as or different from the rising timing of the driving control signal GATE_EN. The falling timing of the compensation signal may be the same as or different from the falling timing of the driving control signal GATE_EN. According to the present embodiment, the signal level, the rising and falling timing, and the like of the compensation signal can be set independently from the signal level, the rising and falling timing, and the like of the driving control signal GATE_EN. Therefore, the color unevenness level can be adjusted from the outside by adjusting the signal level, the rising and falling timing, and the like of the compensation signal.

For example, as illustrated in FIG. 18, the compensation signal line 13 may be configured so that the number of intersecting portions of the second light emission control signal line 4b and the fifth portion 13b is 0. According to such a configuration, the compensation signal does not substantially affect the image signal transmitted by the second light emission control signal line 4b and only affects the image signal transmitted by the first light emission control signal line 4a. Accordingly, the coupling noise that is received by the first light emission control signal line 4a and caused by the driving control signal GATE_EN can be effectively closer to the coupling noise that is received by the second light emission control signal line 4b and caused by the driving control signal GATE_EN.

In the compensation signal line 13, the line width of the fifth portion 13b may be larger than the line width of the sixth portion 13c. Accordingly, while the increase in the number of the fifth portions 13b is suppressed, the area in which the fifth portion 13b and the first light emission control signal line 4a overlap with each other can be increased to increase the parasitic capacitance generated between the fifth portion 13b and the second light emission control signal line 4b. Further, by the fifth portion 13b with the number smaller than the number of the third portions 7c of the driving control signal line 7, the difference between the coupling noises received by the first light emission control signal line 4a and the second light emission control signal line 4b can be reduced. Since the number of the plurality of fifth portions 13b of the compensation signal line 13 can be reduced, the wiring in the image display section 2c is easily guided. In FIG. 19, an example in which the compensation signal line 13 includes two fifth portions 13b is illustrated. However, the compensation signal line 13 may include three or more fifth portions 13b. In FIG. 19, an example in which one ends of the fifth portions 13b are connected to the fourth portion 13a, and the other ends are open ends is illustrated. However, the other ends of the fifth portions 13b may be electrically connected to each other. Therefore, the compensation signal transmitted by the fifth portion 13b can be stabilized.

In the above, the embodiments of the display device of the disclosure are described, but the display device of the disclosure is not limited to the above embodiments and may include appropriate changes in design or improvements. For example, the light emitting unit is not limited to the configuration including the self-luminous light emitting element and may be configured to include a liquid crystal display element and a backlight. The light emitting element may be configured by a liquid crystal display element from which a backlight is omitted.

The disclosure may be embodied in other specific forms without departing from the spirit or essential characteristics thereof. The present embodiments are therefore to be considered in all respects as illustrative and not restrictive, the scope of the disclosure being indicated by the appended claims rather than by the foregoing description and all changes which come within the meaning and the range of equivalency of the claims are therefore intended to be embraced therein.

INDUSTRIAL APPLICABILITY

The display device of the disclosure can be applied to various electronic devices. Examples of the electronic device include a complex and large display device (multi-display), an automobile route guidance system (car navigation system), a ship route guidance system, an aircraft route guidance system, a smartphone terminal, a mobile phone, a tablet terminal, a personal digital assistant (PDA), a video camera, a digital still camera, an electronic notebook, an electronic dictionary, a personal computer, a copying machine, a game equipment terminal device, a television, a product display tag, a price display tag, a commercial programmable display device, car audio, a digital audio player, a facsimile, a printer, an automatic teller machine (ATM), a vending machine, a digital display watch, a smartwatch, and the like.

REFERENCE SIGNS LIST 1, 1A, 1B, 1C, 1D, 1E, 1F, 1G, 1H: Display device
2: Substrate
2a: First surface
2b: Second surface
2c: Image display section
2d: Side surface
3: Pixel array
4: Light emission control signal line
4a: First light emission control signal line
4b: Second light emission control signal line
4c: First wide width portion
4d: Second wide width portion
5: Scanning signal line
6: Scanning signal line driving circuit
6a: Scanning signal line address decoding circuit
6b: Scanning signal line driver circuit
7: Driving control signal line
7a: First portion
7b: Second portion
7c: Third portion
7d: Capacitance adjusting conductor
8: Light emitting unit
9: Light emitting element
10: Thin film transistor (TFT)
11: Capacitive element
12: Switching element
13: Compensation signal line
13a: Fourth portion
13b: Fifth portion
13c: Sixth portion
14: Scanning line selection signal line
15: Signal input pad
16: Electrostatic discharge protection circuit
17: Inverter circuit

The invention claimed is:

1. A display device, comprising:
a substrate;
a pixel array which is placed on a first surface side of the substrate, and in which a plurality of light emitting units are arranged in a matrix form;
a plurality of light emission control signal lines which are arranged in each column of the pixel array on the first surface side;
a plurality of scanning signal lines which are arranged in each row of the pixel array on the first surface side;
a scanning signal line driving circuit which is placed on the first surface side and drives the plurality of scanning signal lines; and
a driving control signal line which is placed on the first surface side and supplies a scanning line driving control signal to the scanning signal line driving circuit; wherein
the driving control signal line comprises at least one first portion which extends in a row direction of the pixel array, a second portion which is connected to the at least one first portion and extends in a column direction of the pixel array, and a plurality of third portions which are connected to the second portion and extend in an opposite direction to the at least one first portion in the row direction of the pixel array, and
the scanning signal line driving circuit is arranged in connection with the third portion of the driving control signal line.

2. The display device according to claim 1, wherein
the plurality of light emission control signal lines comprises at least one first light emission control signal line and at least one second light emission control signal line, and
the at least one first light emission control signal line is placed in a first region in which the at least one first light emission control signal line intersects the at least one first portion of the driving control signal line, and the at least one second light emission control signal line is placed in a second region in which the at least one second light emission control signal line intersects the plurality of third portions of the driving control signal line.

3. The display device according to claim 2, wherein
in a plan view of the display device, a number of intersecting portions of the at least one first light emission control signal line and the at least one first portion in the first region is smaller than a number of intersecting portions of the at least one second light emission control signal line and the plurality of third portions in the second region.

4. The display device according to claim 2, further comprising:
  a capacitance adjusting conductor which is connected to the second portion of the driving control signal line and overlaps with the at least one first light emission control signal line in the plan view of the display device.

5. The display device according to claim 4, wherein
  the at least one first light emission control signal line comprises a second wide width portion which is placed in a portion of the at least one light emission control signal line that overlaps with the capacitance adjusting conductor in the plan view of the display device.

\* \* \* \* \*